(12) United States Patent
Gilchrist et al.

(10) Patent No.: US 10,065,307 B2
(45) Date of Patent: Sep. 4, 2018

(54) SUBSTRATE TRANSPORT APPARATUS

(71) Applicant: Brooks Automation Inc., Chelmsford, MA (US)

(72) Inventors: Ulysses Gilchrist, Reading, MA (US); Christopher Hofmeister, Hampstead, NH (US)

(73) Assignee: Brooks Automation Inc., Chelmsford, MA (US)

(*) Notice: Subject to any disclaimer, the term of this patent is extended or adjusted under 35 U.S.C. 154(b) by 647 days.

(21) Appl. No.: 14/071,314

(22) Filed: Nov. 4, 2013

(65) Prior Publication Data

US 2014/0126987 A1    May 8, 2014

Related U.S. Application Data

(63) Continuation of application No. 11/178,830, filed on Jul. 11, 2005, now Pat. No. 8,573,919.

(51) Int. Cl.
| | |
|---|---|
| *B25J 9/04* | (2006.01) |
| *B25J 9/08* | (2006.01) |
| *B25J 9/10* | (2006.01) |
| *B25J 18/04* | (2006.01) |

(Continued)

(52) U.S. Cl.
CPC .............. *B25J 9/042* (2013.01); *B25J 9/08* (2013.01); *B25J 9/10* (2013.01); *B25J 9/104* (2013.01); *B25J 18/04* (2013.01); *H01L 21/67742* (2013.01); *B25J 9/0087* (2013.01); *Y10S 901/15* (2013.01); *Y10S 901/23* (2013.01);

(Continued)

(58) Field of Classification Search
CPC ... B25J 9/042; B25J 9/043; B25J 9/044; B25J 9/08; B25J 9/104; B25J 18/04; H01L 21/67742; H01L 21/68707; Y10T 74/20323; Y10T 74/20329
USPC ....... 74/490.04, 490.05; 318/568.11, 568.21; 414/744.3, 744.4, 744.5, 941; 901/15, 17, 901/21
See application file for complete search history.

(56) References Cited

U.S. PATENT DOCUMENTS

| | | |
|---|---|---|
| 4,600,355 A | 7/1986 | Johnson |
| 4,728,252 A | 3/1988 | Lada et al. |
| 4,780,047 A | 10/1988 | Holt et al. |

(Continued)

FOREIGN PATENT DOCUMENTS

| | | |
|---|---|---|
| CN | 1332667 | 1/2002 |
| DE | 19939646 | 3/2001 |

(Continued)

*Primary Examiner* — Saul Rodriguez
*Assistant Examiner* — Brendan P Tighe
(74) *Attorney, Agent, or Firm* — Perman & Green, LLP; Colin Durham

(57) ABSTRACT

A substrate transport apparatus having a frame, a drive section and an articulated arm. The drive section has at least one motor module that is selectable for placement in the drive section from a number of different interchangeable motor modules. Each having a different predetermined characteristic. The articulated arm has articulated joints. The arm is connected to the drive section for articulation. The arm has a selectable configuration selectable from a number of different arm configurations each having a predetermined configuration characteristic. The selection of the arm configuration is effected by selection of the at least one motor module for placement in the drive section.

21 Claims, 24 Drawing Sheets

(51) Int. Cl.
*H01L 21/677* (2006.01)
*B25J 9/00* (2006.01)
(52) U.S. Cl.
CPC ........ *Y10S 901/28* (2013.01); *Y10T 74/20305* (2015.01); *Y10T 74/20317* (2015.01); *Y10T 74/20329* (2015.01)

(56) References Cited

U.S. PATENT DOCUMENTS

| | | | |
|---|---|---|---|
| 4,787,813 A | 11/1988 | Stevens et al. | |
| 5,024,116 A | 6/1991 | Kraft | |
| 5,993,142 A | 11/1999 | Genov et al. | |
| 6,084,373 A | 7/2000 | Goldenberg et al. | |
| 6,318,951 B1 | 11/2001 | Schmidt et al. | |
| 6,326,755 B1 * | 12/2001 | Babbs | B25J 9/042 318/568.11 |
| 6,485,250 B2 | 11/2002 | Hofmeister | |
| 6,601,468 B2 | 8/2003 | Grover et al. | |
| 6,634,851 B1 | 10/2003 | Bonora et al. | |
| 6,831,436 B2 | 12/2004 | Gonzalez | |
| 6,893,204 B1 | 5/2005 | Suzuki et al. | |
| 7,013,750 B1 | 3/2006 | Kazami | |
| 7,891,935 B2 | 2/2011 | Kremerman | |
| 8,951,002 B2 | 2/2015 | Kremerman | |
| 2002/0102156 A1 | 8/2002 | Woodruff et al. | |
| 2003/0223853 A1 | 12/2003 | Caveney et al. | |
| 2015/0217446 A1 | 8/2015 | Kremerman | |

FOREIGN PATENT DOCUMENTS

| | | |
|---|---|---|
| JP | 05031686 | 9/1993 |
| JP | 09272086 | 10/1997 |
| JP | 10249757 | 9/1998 |
| JP | 2000076693 | 3/2000 |
| JP | 2000323554 | 11/2000 |
| JP | 2002172583 | 6/2002 |
| JP | 2004535072 | 11/2004 |
| KR | 20010074695 | 8/2001 |
| SU | 763082 | 9/1980 |
| WO | 1993011914 | 6/1993 |

* cited by examiner

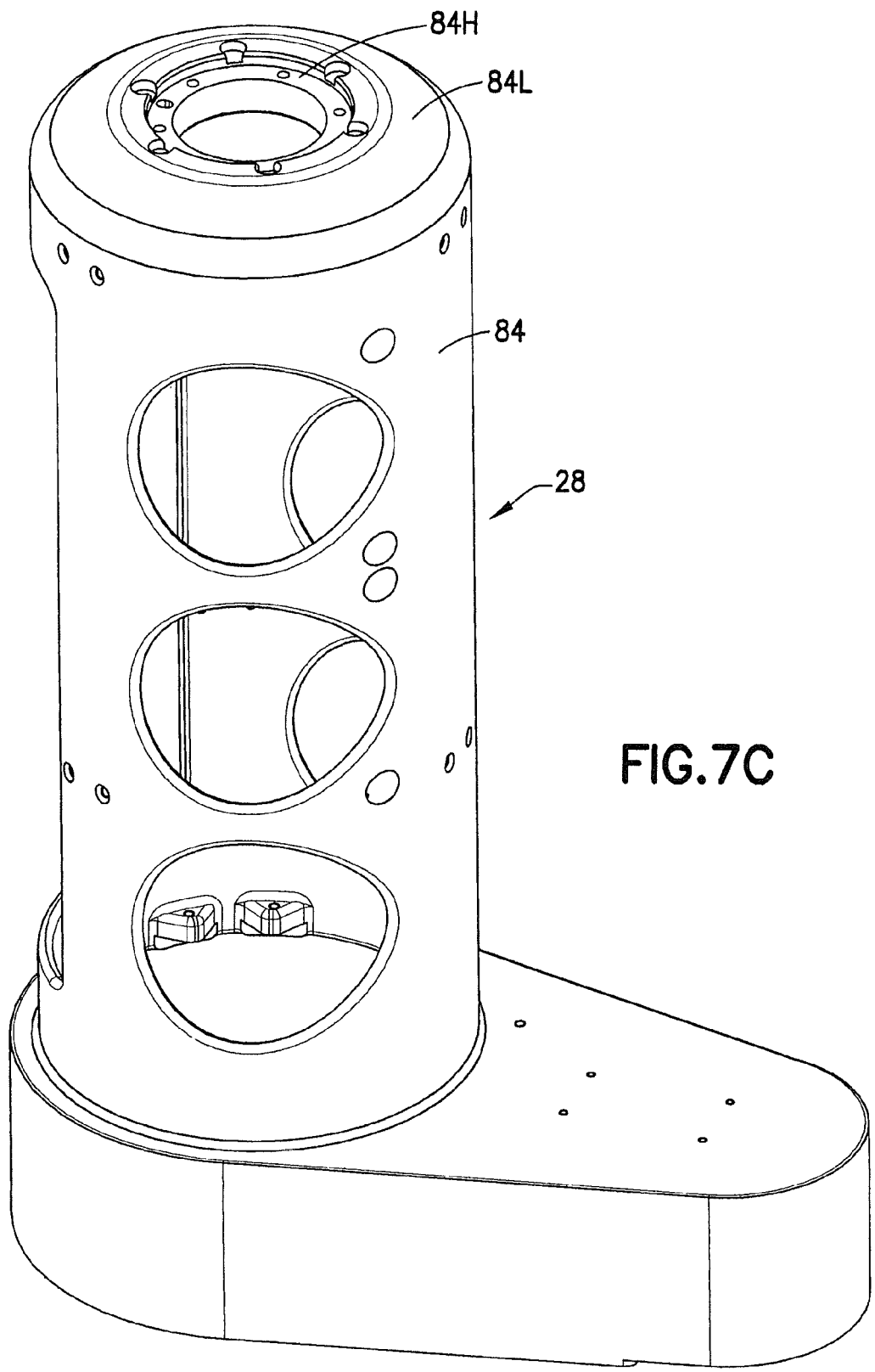

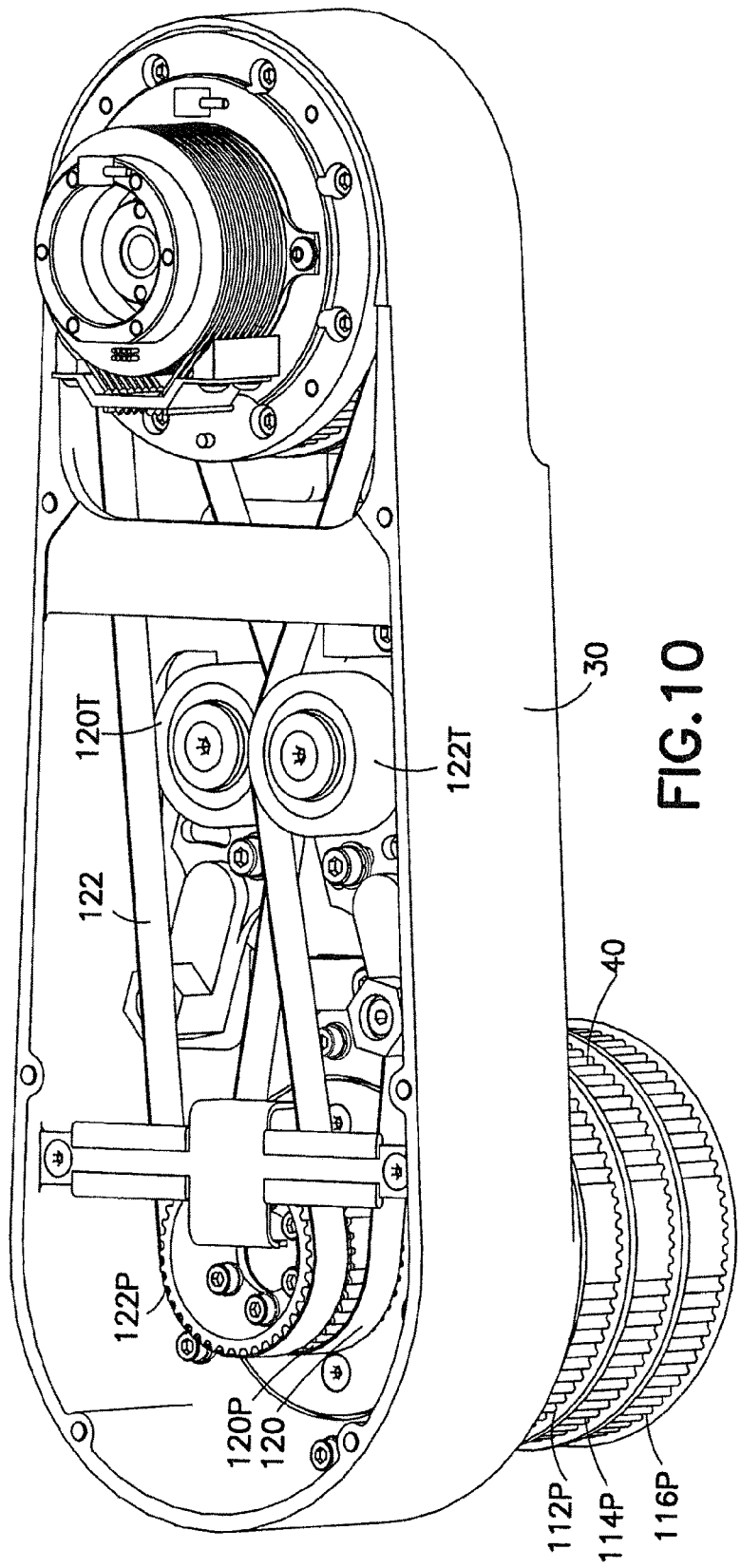

SUBSTRATE TRANSPORT APPARATUS

CROSS-REFERENCE TO RELATED APPLICATIONS

This application is a continuation of U.S. patent application Ser. No. 11/178,830 entitled "Substrate Transport Apparatus" and filed on Jul. 11, 2005 (now U.S. Pat. No. 8,573,919) the disclosure of which is incorporated by reference herein in its entirety.

BACKGROUND

1. Field

The disclosed embodiments relate to substrate transport apparatus and, more particularly, to substrate transport apparatus that are configurable and interchangeable.

2. Brief Description of Related Developments

Advances in electronics and electronic devices have been fueled by the two main prongs of consumer desires; ever more sophisticated and smaller electronics/electronic devices; at ever lower prices. To provide the sought after advances in electronics commensurate advances are desired in the manufacturing (whether facilities, tools or processes) of the electronics. The introduction and continuing expanded use of automation in fabrication of electronic devices has achieved a two fold benefit corresponding almost directly with the main consumer desires. Automated manufacturing of electronics has provided between precision and reduced cost of fabrication. The improved precision of automated manufacturing leads to the ability to increase and improve miniaturization of electronic components. Also, though having a higher one time cost, than non-automated manufacturing systems, the automated manufacturing systems may be operated on a substantially continuous basis ultimately resulting in lower manufacturing costs for the devices produced therewith. Further, the improvement in precision/accuracy of the automated manufacturing devices, over their non-automated counterparts, results in commercially significant reductions in manufacturing rejects and defects thereby again leading to lower manufacturing costs for the fabricated devices. One area of manufacturing of electronic devices that has lent itself well to using automation has been the transport apparatus, devices, also referred to as robots, handling and transporting flat panels (e.g. wafers, reticles, pelicles, flat panel displays) between various processing stations. One example of a conventional robot for use in a clean room environment is disclosed in U.S. Pat. No. 4,787,813, issued Nov. 29, 1988. The conventional robot disclosed therein has a drive system with a support assembly. A first arm of the robot is rotatably supported by the support assembly and is raised and lowered by the support assembly. Drive structure for rotating the support assembly is mounted on a base. Drive structure for rotating a second arm and end effector are mounted at the upper end of the support assembly. U.S. Pat. No. 6,634,851, issued Oct. 21, 2003 discloses another example of a conventional workpiece handling robot that has a base and backbone. The base of this conventional robot has a linear drive system and a mast on the linear drive system. A shoulder drive system rotates the mast and proximal arm link mounted to the mast. An elbow drive is mounted to the proximal link for rotating a distal link relative to the proximal link. The conventional robot has an end effector that is slaved. As may be realized, the aforementioned conventional robot has limited freedom of movement as it lacks a drive system, or an independent drive axis, for independently driving the robot end effector. Nor can this conventional robot be readily configured to provide a robot configuration wherein the end effector is independently movable. The aforementioned conventional robots are exemplary of conventional robots in general. Each robot is specifically configured for a particular arrangement. Moreover, once the robot configuration is set, the configuration is substantially fixed and non-variable in major respects. In effect the conventional robots cannot be reconfigured without substantially tearing down the robot and rebuilding it anew. This limits the interchangeability and interoperability of conventional robots and results in FAB operators having many generally similar yet not interchangeable robots. By way of example, a FAB operator may have conventional 3 axes, 4 axes and 5 axes robots (each for a corresponding processing station or tool where a 3 axes, 4 axes or 5 axes robot is appropriate). Although generally similar in configuration (e.g. the conventional robots are all scara type), nevertheless the conventional 3 axes, 4 axes and 5 axes are not interchangeable, and reconfiguring of the conventional robot (e.g. configuring a 3 axes conventional robot to 5 axes or vice versa) involves complete tear down and rebuilding of the conventional robot. Hence, if a conventional robot (e.g. 3 axes) is brought off line, such as for maintenance, and a spare conventional robot with a different configuration is available (e.g. 4 axes), the spare conventional robot with the different configuration is not swappable with the offline robot nor can the spare robot be reconfigured so that it may become swappable with the offline robot. Accordingly, in the case of conventional robots production at the process stations served by the offline robot remains stopped until the offline robot is restored, or the FAB operator acquires another robot with the same configuration. This is highly undesirable.

Another problem of conventional robots, as may be realized from the aforementioned examples, is that the robots movement definition (e.g. the difference between the true position of a desired point/location on the robot and the expected position of the same point commanded by the robot controller) is rather limited. Though this limited movement definition may arise from a number of factors, one large contributing factor are undefined robot motions (robot movements that are not sensed and registered by the robot controller). One cause of undefined robot motions is the flexibility of the robot (i.e. its structure or drive system), and the foundation supporting the robot due to dynamic loads. The exemplary embodiments of the present invention overcome these and other problems of conventional workpiece fabrication systems as will be described below.

SUMMARY OF THE EXEMPLARY EMBODIMENTS

In accordance with one exemplary embodiment, a substrate transport apparatus is provided. The substrate transport apparatus comprises a frame, a drive section and an articulated arm. The drive section is connected to the frame. The drive section has at least one motor module that is selectable for placement in the drive section from a number of different interchangeable motor modules. Each having a different predetermined characteristic. The articulated arm has articulated joints. The arm is connected to the drive section for articulation. The arm has a selectable configuration selectable from a number of different arm configurations each having a predetermined configuration characteristic. The selection of the arm configuration is effected by selection of the at least one motor module for placement in the drive section.

In accordance with another exemplary embodiment, a substrate transport apparatus is provided. The transport apparatus comprises a frame, a drive section, and an articulated arm. The drive section is connected to the frame. The articulated arm is connected to the drive section for articulation of the arm. The arm has an upper arm length, a forearm link, and at least one end effector link. The forearm link is pivotably joined to the upper arm link and the end effector is pivotally joined to the forearm link. The drive section has a first drive section portion and a motor module connected to the first drive section portion. The motor module has at least one motor for independently pivoting either the forearm relative to the upper arm, or the end effector relative to the forearm. The motor module is selectable for connection to the first drive section portion from different interchangeable motor modules each having a different predetermined characteristic.

BRIEF DESCRIPTION OF THE DRAWINGS

The foregoing aspects and other features of the present invention are explained in the following description, taken in connection with the accompanying drawings, wherein:

FIGS. 7B-7C are respectively a top perspective view of the upper arm in FIG. 7, and a bottom perspective view of the upper in FIG. 7;

FIG. 10 is a perspective view of a forearm of the substrate transport apparatus in FIG. 2;

DETAILED DESCRIPTION OF THE PREFERRED EMBODIMENT(S)

Figure 1:
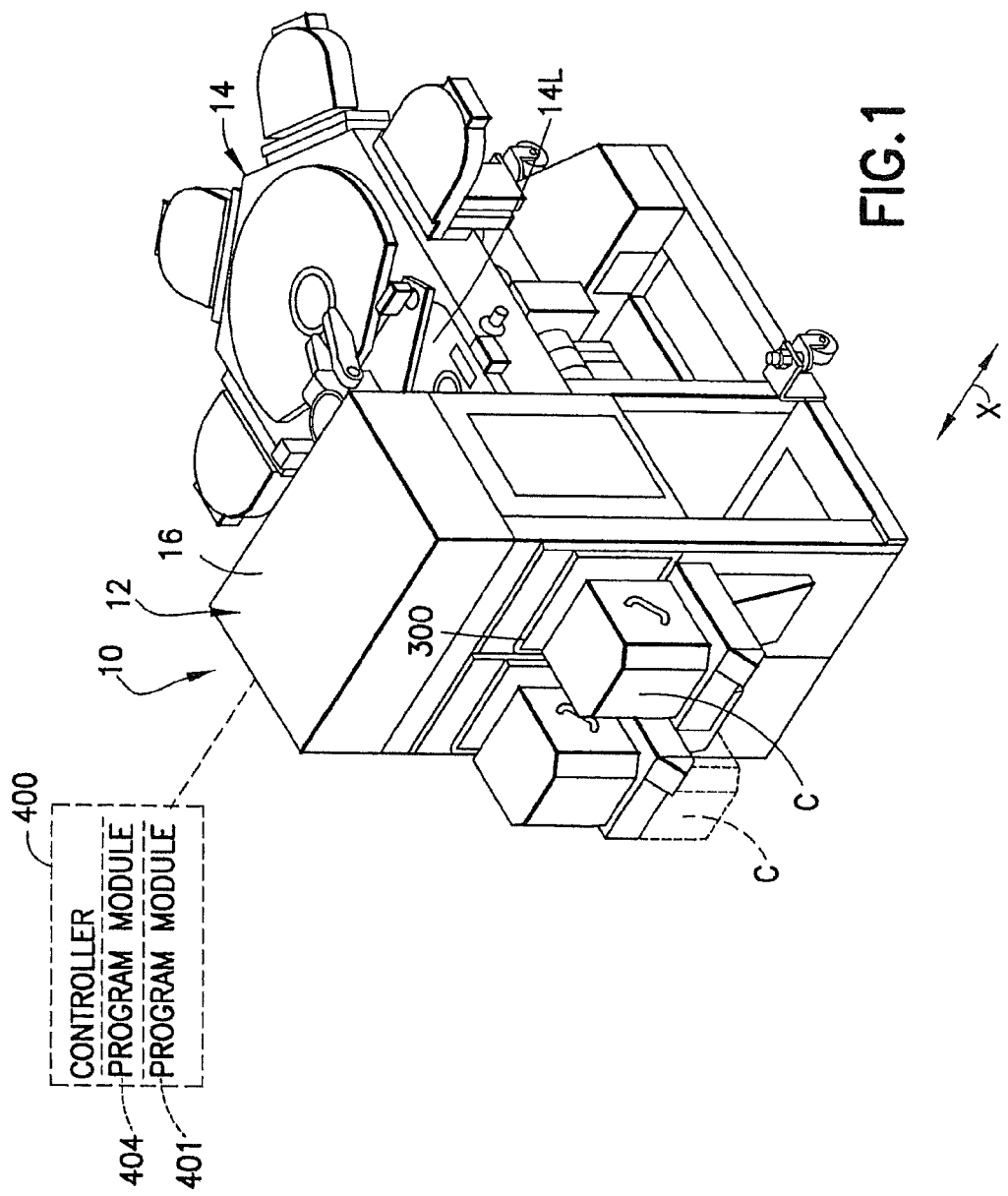
FIG. 1 is a schematic perspective view of a substrate processing apparatus, incorporating features of the present invention in accordance with one exemplary embodiment, and substrate transport containers C.

Referring to FIG. 1, a perspective view of a substrate processing apparatus 10 incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

In the embodiment illustrated in FIG. 1, the apparatus 10 has been shown, for example purposes only, as having a general substrate batch processing tool configuration. In alternate embodiments, the substrate processing apparatus may have any other suitable configuration, as the features of the present invention, as will be described in greater detail below, are equally applicable to any substrate processing tool configuration including tools for individual substrate processing, stockers, sorters, metrology tools or any other desired tool. The apparatus 10 may be capable of handling and processing any desired type of flat panel or substrate such as 200 mm or 300 mm semiconductor wafers, semiconductor packaging substrates (e.g. high density interconnects), semiconductor manufacturing process imaging plates (e.g. masks or reticles), and substrates for flat panel displays. The apparatus 10 may generally comprise a front section 12 and a rear section 14. The front section 12 (the term front is used here for convenience to identify an exemplary frame of reference, and in alternate embodiments the front of the apparatus may be established on any desired side of the apparatus). The front section 12 has a system (as will be described in greater detail below) providing an interface allowing the importation of substrates from the FAB into the interior of the apparatus 10. The front section 12 also generally has a housing 16 and automation components located in the housing handling substrates between the rear section 14 and the front section interface to the exterior. The rear section 14 is connected to the housing 16 of the front section. The rear section 14 of the apparatus may have a controlled atmosphere (e.g. vacuum, inert gas), and generally comprises a processing system for processing substrates. For example, the rear section may generally include a central transport chamber, with substrate transport device, and peripheral processing modules for performing desired manufacturing processes to substrates within the apparatus (e.g. etching, material deposition, cleaning, baking, inspecting, etc.). As noted before, in alternate embodiments the rear sections of the apparatus may be configured to process substrates as a sorter stocker or other desired processing or handling tool. Substrates may be transported, within the fab, to the processing apparatus 10 in containers L. The containers L may be positioned on or in proximity to the front section interface. From the containers, the substrates may be brought through the interface into the front section 12 using automation components in the front section. The substrates may them be transported, via load locks 14L, to the atmospherically controlled rear section for processing in one or more of the processing modules. Processed substrates may then be returned, in a substantially reversed manner, to the front section 12 and then to the transport containers F for removal.

The front section 12, which may otherwise be referred to as an environmental front end module or EFEM, may have a shell or casing defining a protected environment, or mini-environment where substrates may be accessed and handled with minimum potential for contamination between the transport containers T, used to transport the substrates within the FAB, and the load locks 14L providing entry to the controlled atmosphere in the rear processing section 14. Load ports or load port modules 24 (two are shown in FIG. 1 for example purposes, but more or fewer may be used) are located on one or more of the sides of the front section providing the interface between the front section and FAB. The load port modules may have closable ports 300 forming a closable interface between the EFEM interior and exterior. As seen in FIG. 1, the load port modules may have a support area for a substrate transport container C. A secondary holding area may also be provided under the support area, where transport containers may be temporarily buffered. The transport container support area may allow automated movement of the transport container C supported thereon to a final or docked position.

Figure 2:
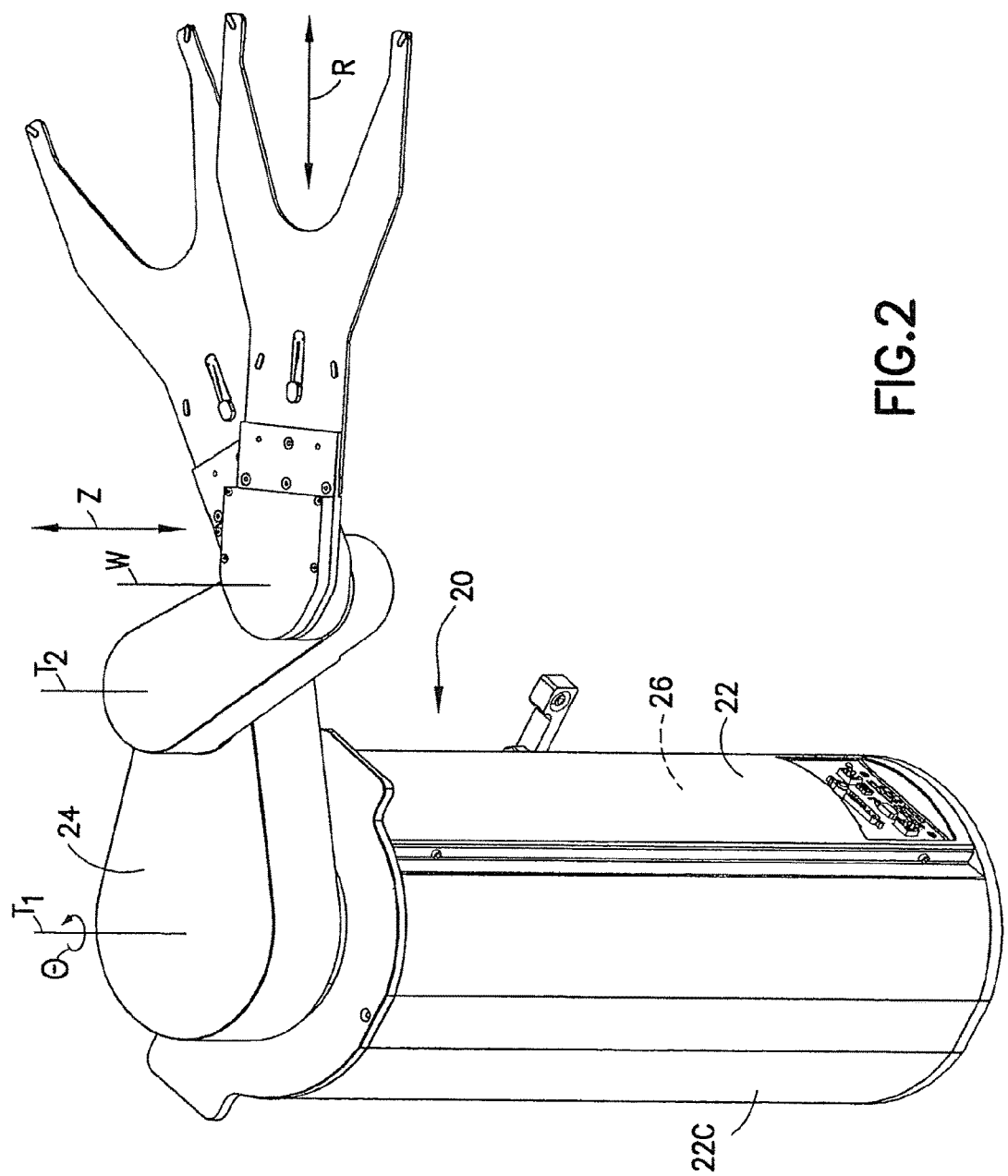
FIG. 2 is a perspective view of a substrate transport apparatus of the processing apparatus shown in FIG. 1.

As noted before, the front section of apparatus 10 may have automation components to effect transfer of the workpieces between the transport containers C, interfaced to the apparatus, and the various processing stations in the front section or rear section of the apparatus. Referring now also to FIG. 2, the apparatus 10 may have a workpiece or substrate transport apparatus 20 in the front section 12 with a reach that is sufficient to pick/place substrates in the containers C and any desired stations in the front and rear sections 12, 14. For example, the transport apparatus 20 may be capable of reaching, through closable openings 300, to pick/place substrates inside the container(s) T. The transport apparatus 20 may also be capable of reaching to pick/place substrates inside loadlocks 14L. Hence, transport apparatus 20 is capable of picking substrates from the container(s) and transporting the substrates for placement inside loadlocks 14L, and vice versa. The transport apparatus 20 generally has a support structure or base 22, a movable arm 24 and a drive system 26. The drive system 26 is connected to the support structure 22, and the movable arm 24 is operably connected to the drive system 26 so that the drive system can move the arm. The support structure 22 attaches the transport apparatus 20 to the front section 12 of apparatus 10. The front section 12 of apparatus 10 may have a traverser (not shown) with a carriage capable of traversing laterally relative to the front section (in the direction indicated by arrow X in FIG. 1). In this case, the support structure 22 may be attached to the traverse carriage of the traverser. Alternatively, the front section may not have a traverser, wherein the support structure may be attached to the structure of the front section. The transport apparatus support structure may have a rigid spine load bearing member. The support structure may have a side mounting arrangement for mounting to the front section. The side mounts of the support structure may depend from the side of the rigid spine member of the support structure as will be described in greater detail below. The side mounts define a kinematic coupling enabling the transport apparatus to be interchangeable. The movable arm 24 has articulate links and end effector(s) for holding substrate(s). The drive system 26 has independent drives joined to the movable arm to move the arm end effector(s) in the R, θ and Z directions (as indicated by arrow R, θ and Z in FIG. 1). The Z drive section of the drive system may be integrated into the spine member as will be described in greater detail below. The drive section may also have a removable drive module that is selectable from a number of different interchangeable drive modules to select a drive configuration of the drive system. Also as will be described below, the removable module can be swapped with another interchangeable module to change the number of independent drive axes of the drive system and hence reconfigure the drive system. This also allows the movable arm to be reconfigured. The movable arm may be mounted on a turret. The turret and one of the articulated arm links may be formed integrally as a one piece member as will be further described. The selectable drive module may be removably mounted to the arm portion of the turreted arm link.

Figure 2A:
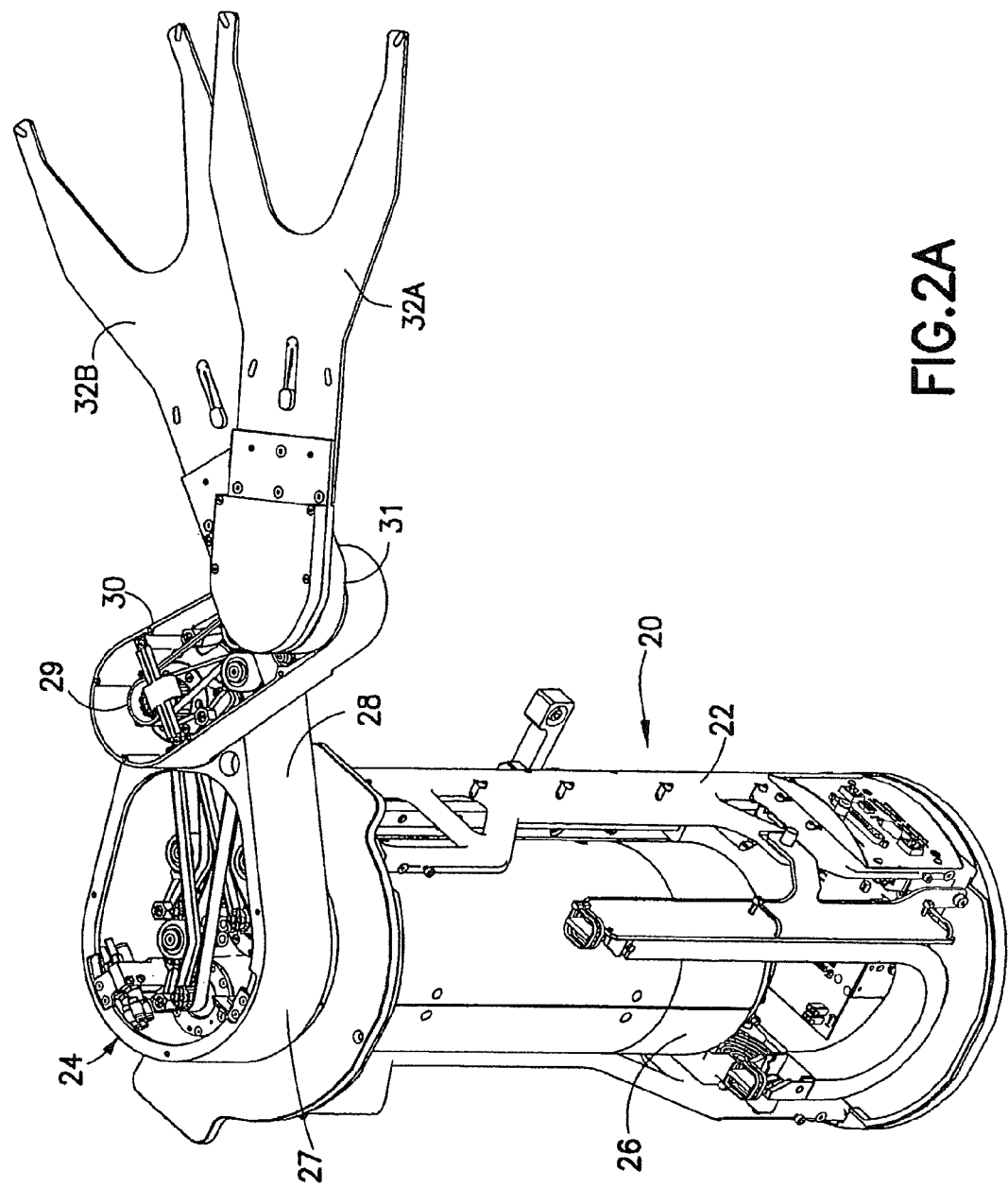
FIG. 2A is another perspective view of the substrate transport apparatus in FIG. 2 with some section removed for clarity.
Figure 3:
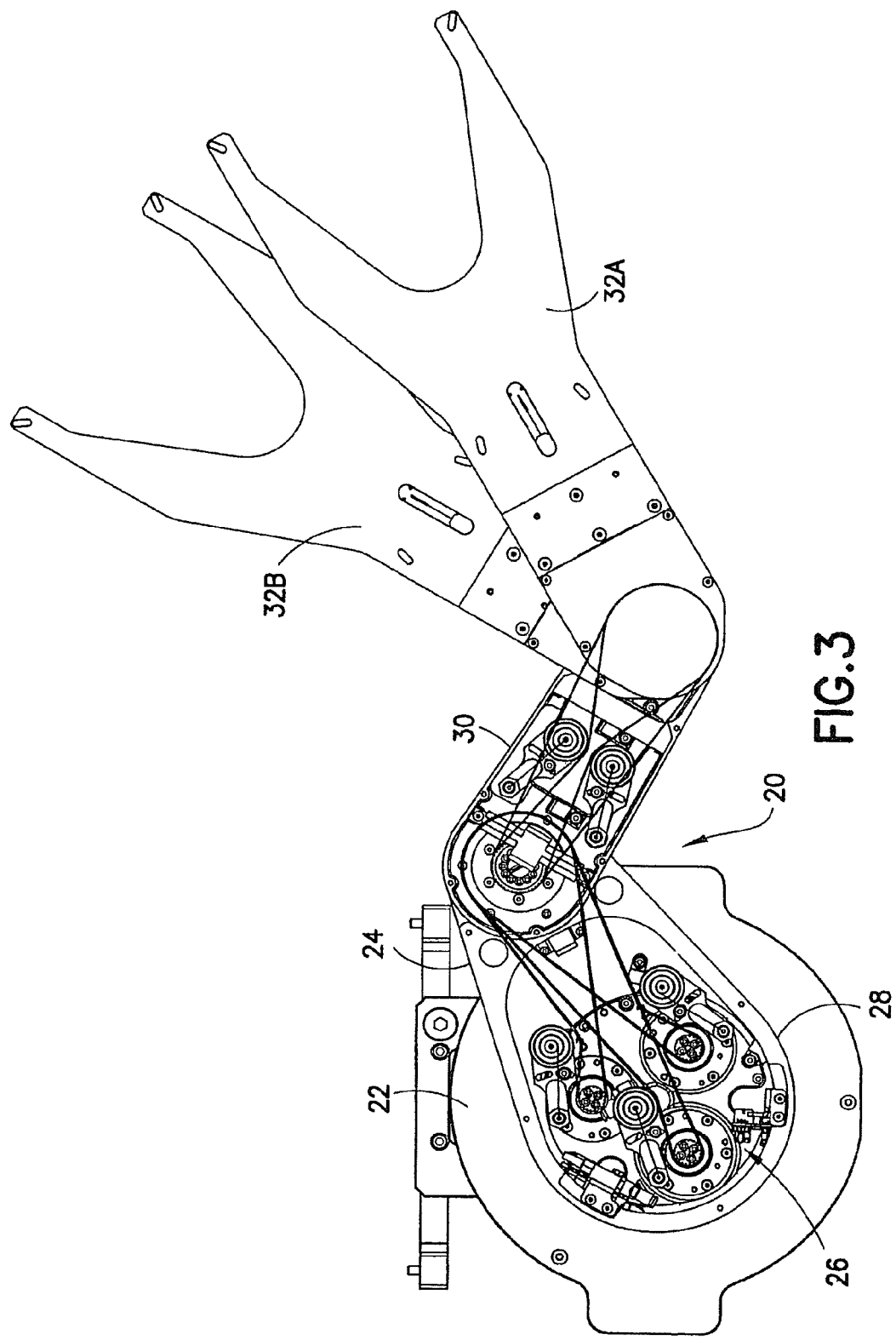
FIG. 3 is a plan view of the substrate transport apparatus.
Figure 4A:
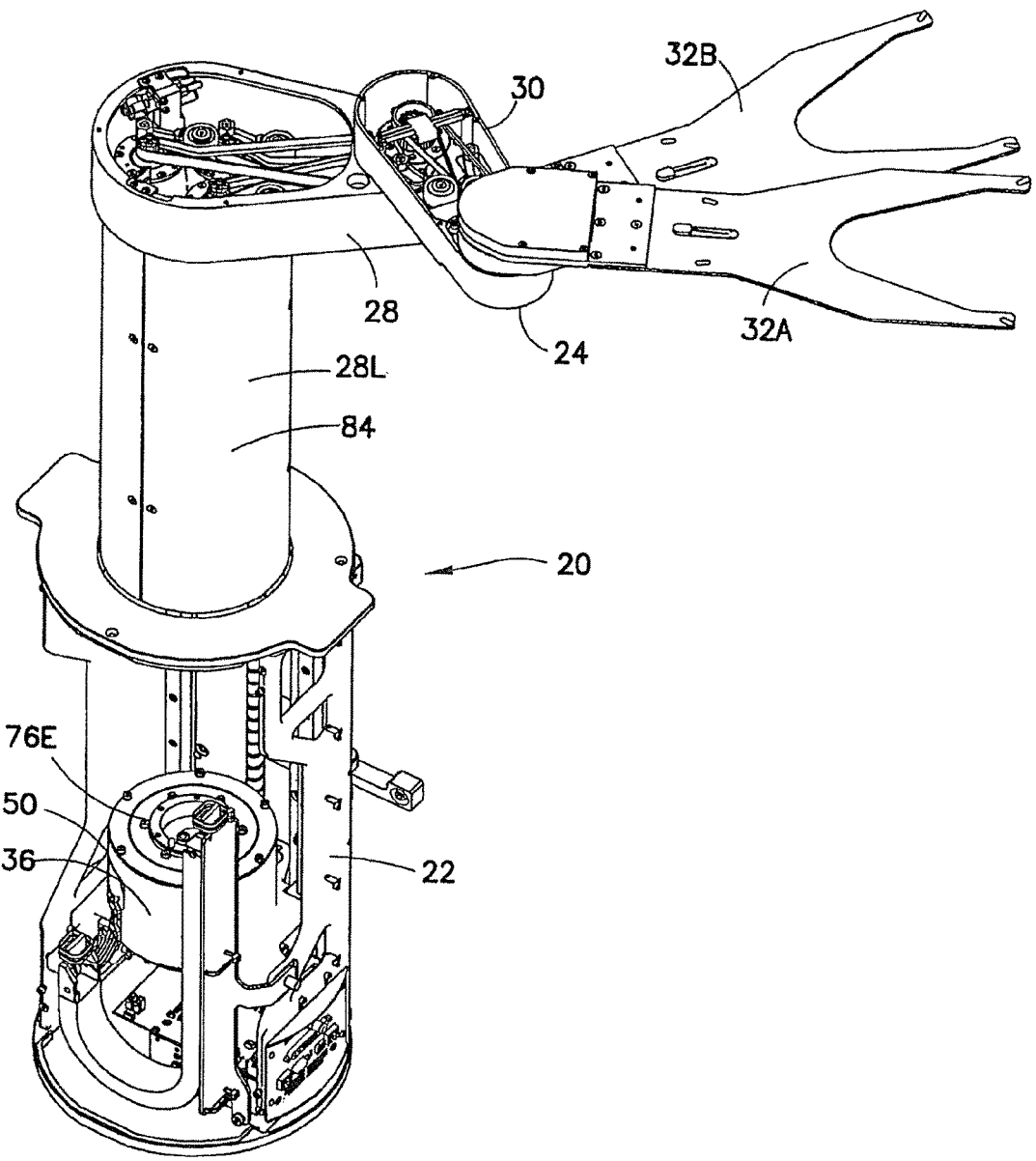
FIGS. 4A-4B respectively are exploded perspective views of the substrate transport apparatus showing portions of the drive system of the transport apparatus.
Figure 4B:
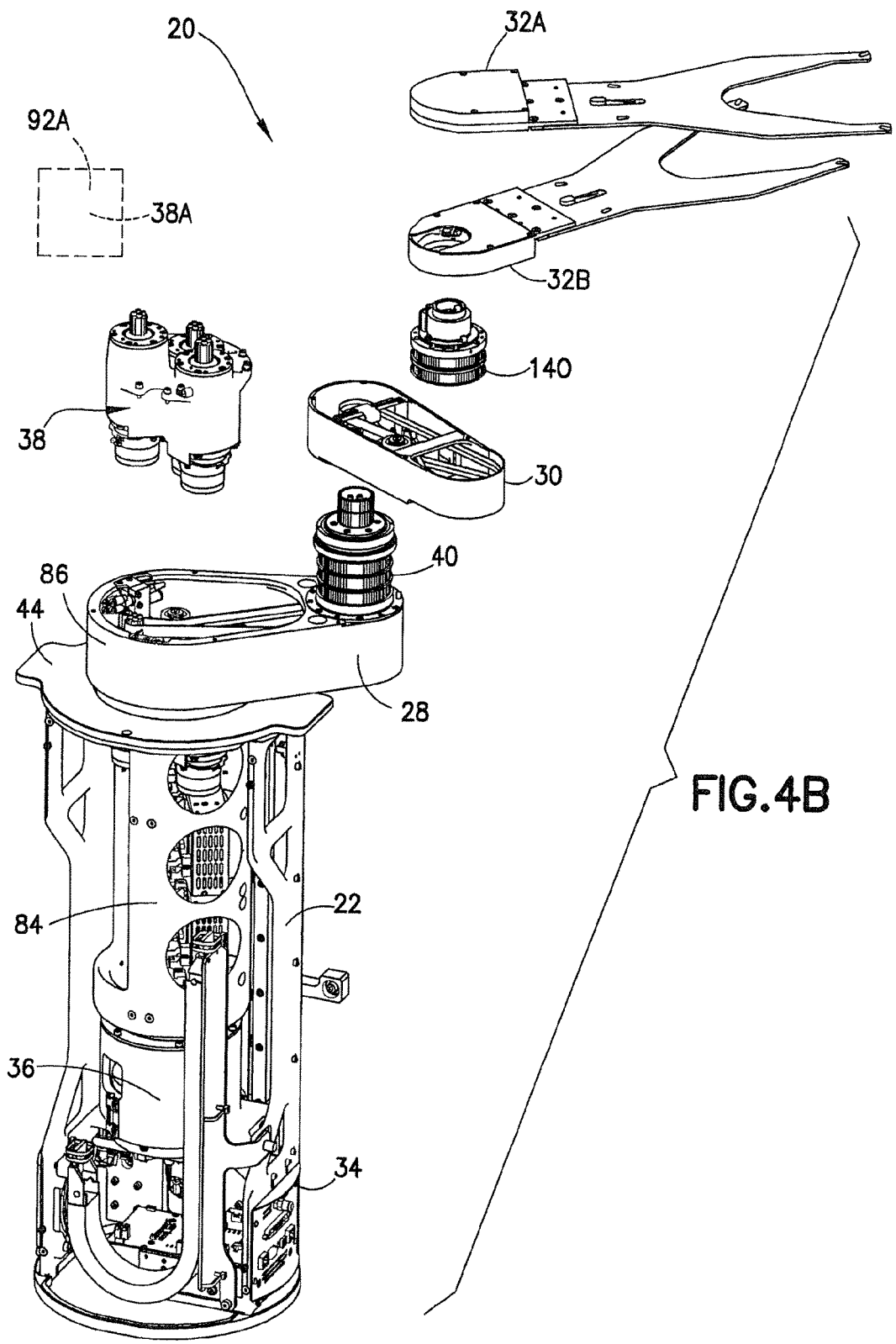

FIG. 2A is another perspective view of the substrate transport apparatus 20 with portions of the apparatus removed for clarity. FIG. 3 is a plan view of the apparatus 20, and FIGS. 4A-4B are respectively an exploded perspective view of the apparatus with the arm 24 exploded from the support structure 22, and another exploded perspective view with the arm links and a portion of the drive system shown in an exploded manner. In this exemplary embodiment, the articulated arm 24 is illustrated as being a scara type arm with an upper arm 28, a forearm 30 and end effectors 32A, 32B. In alternate embodiments, the articulated arm may be of any suitable type, and may have more or fewer end effectors. As seen in FIGS. 2-2A, the upper arm 28 is pivotally mounted (as will be described in greater detail below) to rotate relative to the support structure 22 about shoulder axis T. The pivot mount of the upper arm 28 to support structure 22 forms shoulder joint 27. The forearm 30 is pivotally mounted to the upper arm 28. The pivot joint 29 between forearm 30 and upper arm 28 may be referred to as elbow joint, with corresponding rotation axis $T_2$. The end effectors 32A, 32B are pivotally mounted to the forearm 30 at the wrist joint 31, having axis of rotation W (see FIG. 2). As noted before, the drive system 26, in the exemplary embodiment, may have a Z drive section 34, a shoulder or $T_1$ axis drive section 36 and drive section 38 for driving one or more arm links about one or more other rotation axes as will be described below. In the exemplary embodiments the Z drive section 34 and $T_1$ drive section are mounted to the support structure 22. Drive section 38 is mounted to the arm 24.

Figure 5A:
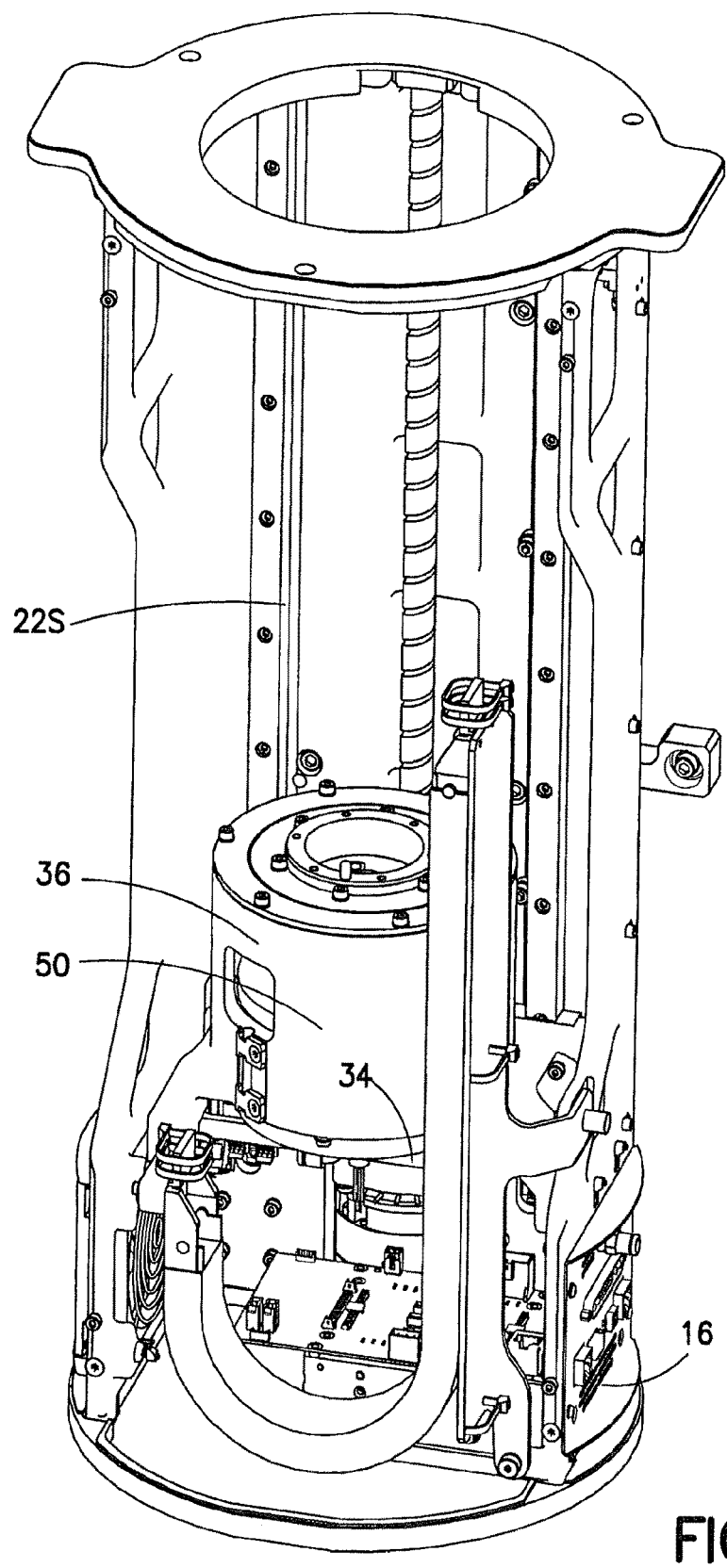
FIGS. 5A-5B are respectively a perspective view of a transport apparatus support structure with a linear drive carriage of the transport apparatus drive system located therein, and another perspective view of the transport apparatus support structure with the drive carriage removed.
Figure 5B:
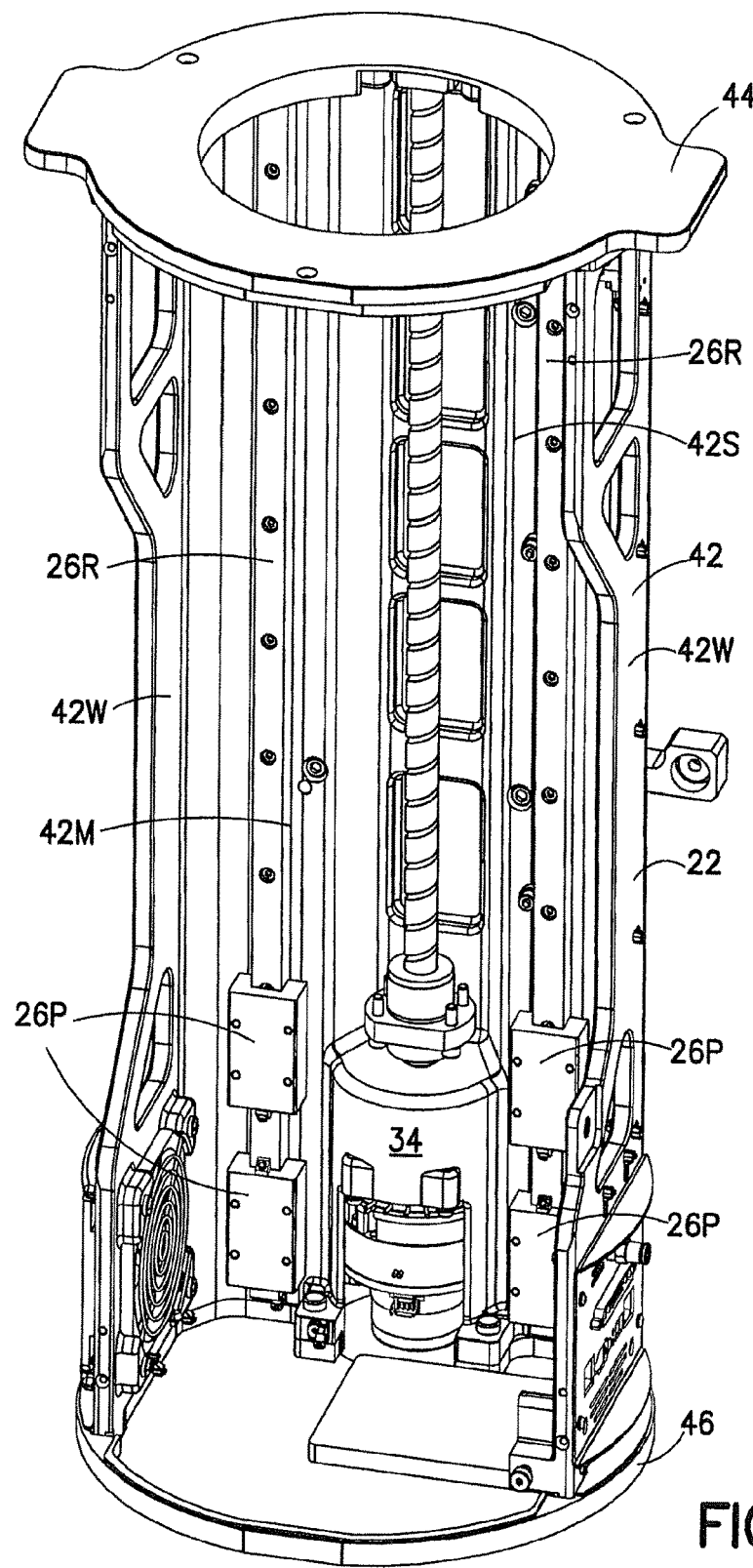
Figure 5C:
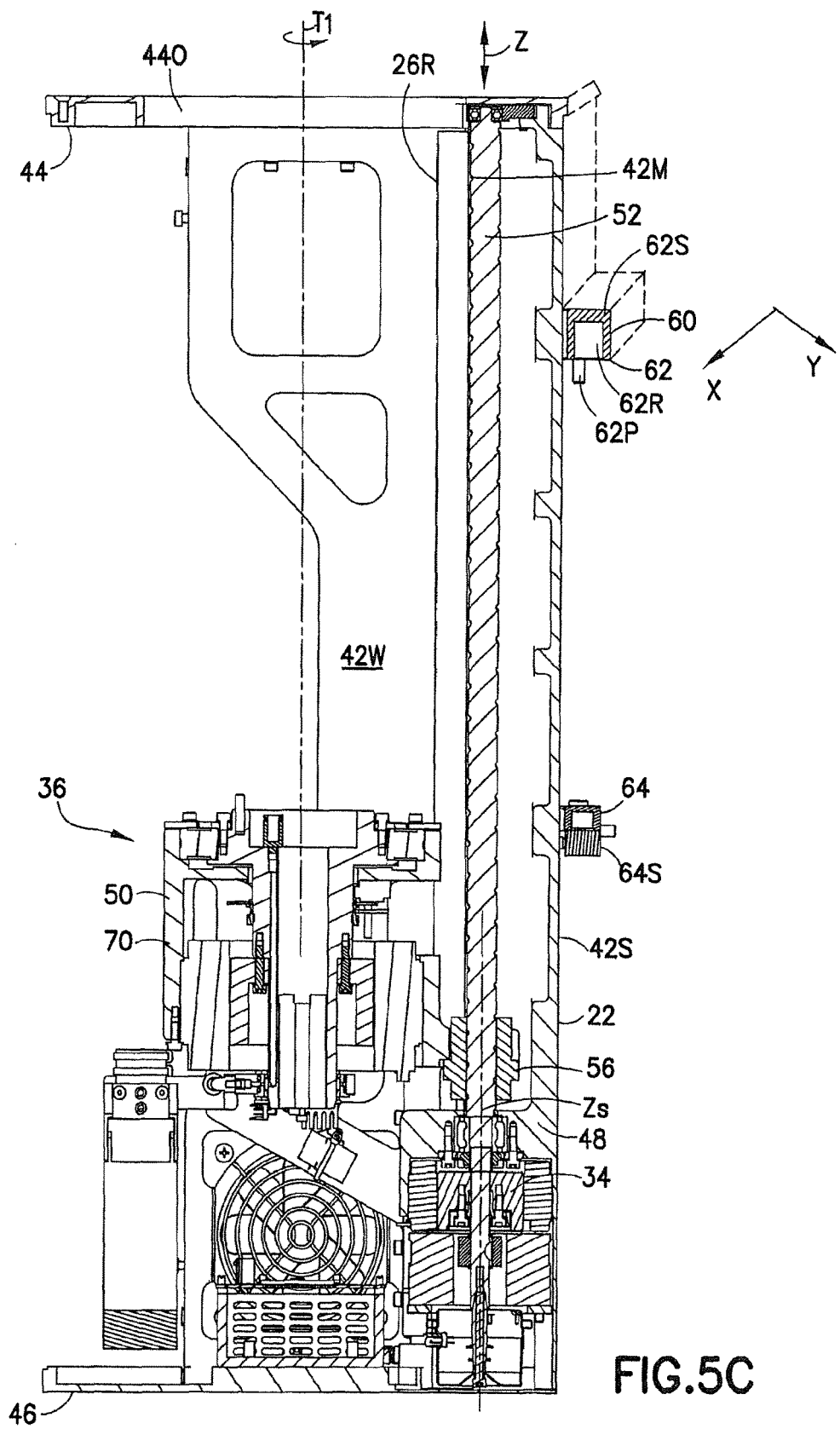
FIG. 5C is a elevation cross sectional view of the support structure in FIG. 5A.

Still referring to FIG. 2, the support structure 22 is shown with an environmental casing 27C enclosing the support structure. The support structure 22 is best seen in FIG. 5B. The support structure 22 generally comprises a spine member 42 and end plates 44, 46. The spine member 42 extends substantially the entire length of the support structure 22. End plates 44, 46 are connected to the opposite ends of the spine member 42 as shown. In this embodiment, the support structure 22 is of monocoque or semi-monocoque construction (i.e. the walls or shell formed by the spine member 42 are load bearing and carry the loads imparted on the support structure). As seen in FIG. 5B, the spine member 42 has an elongated, general channel shape. The spine member has a backside 42S and opposing flange walls 42W to form the channel shape and define an interior space in the spine member that project as shown from the backside. In this embodiment, the spine member 42 is of unitary construction (i.e. a one piece member). The spine member may be forged, cast or formed in any other suitable manner from any suitable metal, such as stainless steel or aluminum alloy. In alternate embodiments the spine member may be made from any other suitable material including plastics, ceramics or composites. The spine member is highly rigid compared to space frame construction defining a similar interior space as the spine member 42. Referring now also to FIG. 5C, there is shown a cross-section of the support structure 22. As seen in FIG. 5C, the end plates 44, 46 are joined to opposite ends of the spine member 42 using a general rabbit joint configuration.

The end plates 44, 46 help define the interior space of the support structure that is of sufficient size to encompass portions of the drive system and the turret of the articulated arm. At least one of the end plates 46 may provide a mounting platform for components, such as an electronics package E supporting for example power and communication signals for drive system 26. The spine member 42, however, serves as the primary load bearing member as substantially all static and dynamic loads of the transport apparatus 20 are ultimately delivered to and borne by the spine member. Moreover, as will be described further below, the drive system 26 and the arm 24 supports therefrom are, foundationed directly from the rigid spine member. The drive system sections that establish the prime drive axes (e.g. shoulder axis $T_1$ and Z drive axis shown in FIG. 1, which define the attitude of the substrate transport plane and along which the R, θ motions of the end effector(s) 32A, 32B are conducted) are integrated in the spine member. Thus, the rigid spine member 42 of the support structure 22, rigidly fixes the prime drive axes relative to each other during static and dynamic loading imparted by the motions of the drive system and the arm, or by motions of the traverser, in the event the transport apparatus 20 is mounted on a traverser.

As seen best in FIG. 5B, the linear rails 26R for the drive system Z-drive section are integrated with the spine member 42. The linear rails 26R are the guide rails for the platens 26P of the drive system Z-carriage (see also FIG. 5A). Thus, rails 26R help define the orientation of the Z-axis along which carriage 50 is moved. In this embodiment the linear rails 26R are located on backside 42S of the spine member 42, though in alternate embodiments the rails may be placed in any other desired location on the spine member. Also, in this embodiment the rails 26R are fastened to the spine member 42. The rails may be fastened to the spine member with any suitable mechanical fasteners, or may be attached by brazing, welding or any other suitable metallic or chemical bonding. In this embodiment, the backside 42S of the spine member may have seating surfaces 42M (see also FIG. 5L which shows a cross-section view of the support structure 22) on which the linear rails 26R are seated when mounted to spine member 42. The seating surfaces 42M may be formed, for example by machining or other suitable forming process, to be substantially parallel with each other (e.g. left side and right side seating surfaces 42M are substantially parallel or if desired substantially co-planar) and parallel to the Zs axis (see FIG. 5C) defined by the spine member as will be described below. In alternate embodiments, the slide rails may be integrally formed on the unitary construction spine member.

Figure 5D:
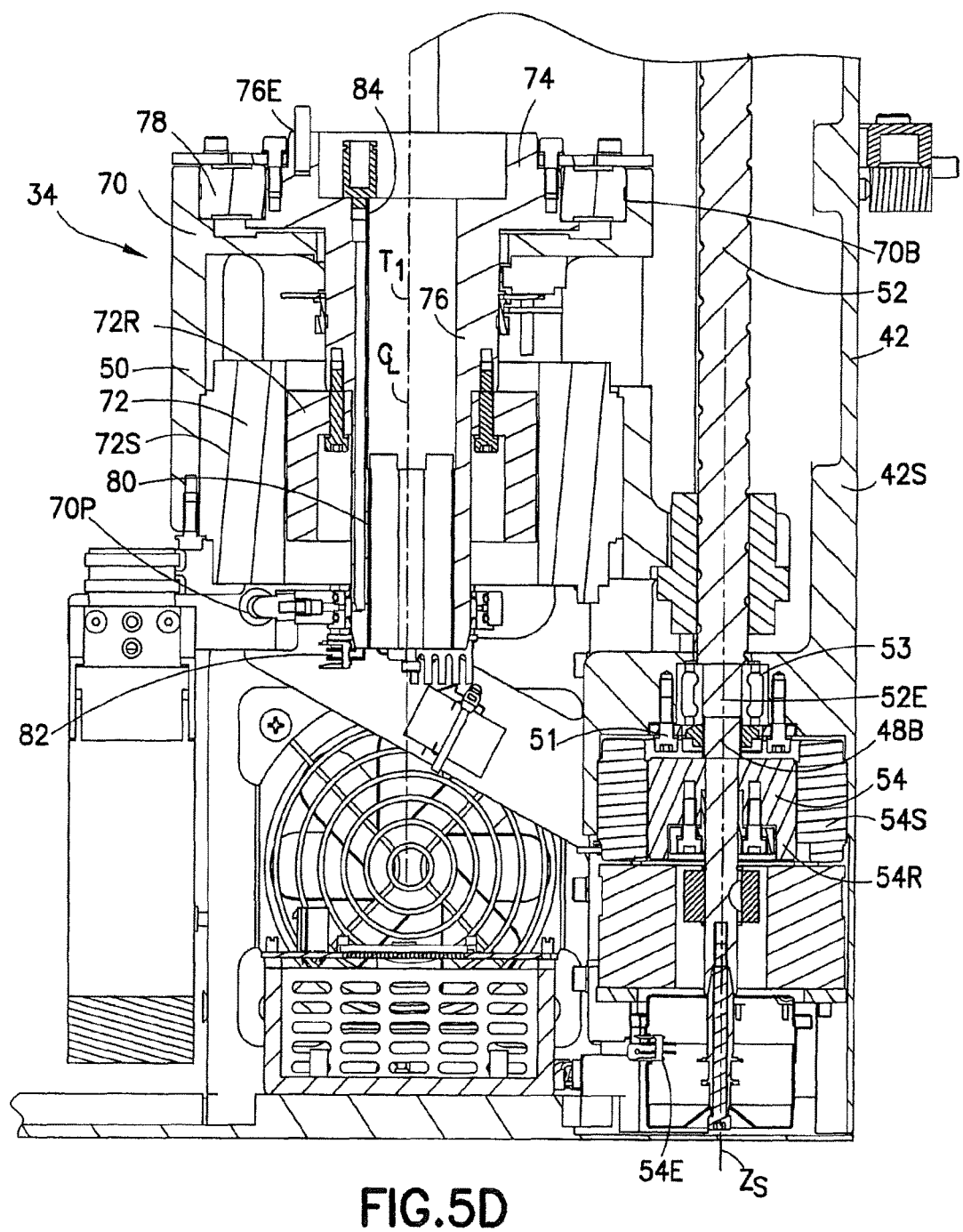
FIG. 5D is an enlarged partial cross sectional view of the support structure and a portion of the linear drive carriage in FIG. 5A.

Referring still to FIGS. 5B-5C, and also referring to FIG. 5D showing an enlarged partial cross-sectional view of the support structure 22 and drive system 26, the spine member 42 has a collar 48. In this embodiment, the collar 48 is formed integrally with the unitary construction spine member 42. The collar 48 is located as shown, on the backside 42S of the spine member. The collar 48 may be substantially centered between the two linear rails 26R as shown in FIG. 5B. In alternate embodiments, the collar may be located at any other desired position on the spine member. The collar may also be mechanically attached to the spine member with suitably rigid attachment. As seen in FIGS. 5B-5D, the collar 48 holds and provides the foundation support for the Z-drive section of the drive system 26. Thus, the Z-drive section of the drive system is integrated into the spine member 42S by integral collar 48. As noted before and seen best in FIGS. 5C-5D, in this embodiment drive system 26 has Z-drive section 34 that is a linear drive generally comprising motor 54 driving ball screw 52. In alternate embodiments, the drive system may have any other desired type of linear drive providing a Z axis drive. Motor 54 may be any suitable motor, such as a brushless DC, AC or stepper motor. The ball screw 52 may be coupled to an output shaft of the motor, or may have a shaft extension 52E, extending into the motor, on which the motor rotor 54R is mounted as shown in FIG. 5D. The Z-drive motor 54 may also have a suitable encoder 54E, mounted to the motor shaft or shaft extension, to facilitate the desired motor control with tool controller 400 (see also FIG. 1).

As seen in FIG. 5D, the collar 48 has a bore 48B with center axis Zs. The ball screw 52 is radially held in bore 46B by suitable bearings 53. Thus, the ball screw 52 is concentric with bore 48B in the collar, and the center axis of the ball screw, or the Z axis of motion provided by the screw when rotated by motor 54, is substantially coincident with the center axis Zs of the bore 48B in collar 48. The bore center axis Zs hence defines the Z-axis of motion of the Z-drive section 34. Moreover, as the linear rails 26R are established substantially parallel to axis Zs (arising from the parallelity of the seating surfaces 42M to axis Zs as described before) which is also substantially the center axis of the ball screw 52, and as both the rails 26R and balls screw 52 are held on the common rigid spine member 42, this ensures that the parallelity condition initially established between the rails 26R (and hence the Z-carriage 50 riding on the rails) and the ball screw 52 driving the Z-carriage 50 in the Z-axis is ridigly maintained at all times. Static and dynamic loads on the drive system 26 and support structure 22 during operation of the transport apparatus 20 will not cause any change in alignment between the ball screw and rails, and hence no change in alignment between Z-axis and the shoulder axis of rotation $T_1$ (defined by carriage 50 as will be described further below). Thus, as noted before, the prime axes of motion $T_1$, Z of the drive system that define the attitude of the substrate transport plane remain in a substantially rigid orientation. The ball screw 52 is vertically locked to collar 48 by a suitable support ring 51 as shown in FIG. 5D. In the embodiment shown, the collar 48 may extend to form a housing for motor 54. The motor stator 54S may be mounted within the bore 48B of the collar. In alternate embodiments, the Z-drive motor may be in a separate housing that in turn is supported from the spine member so that the position of the motor relative to the ball screw holding collar of the spine member is substantially rigidly maintained. As seen in FIG. 5C, the upper end of the ball screw 52 is held by the end plate 44. A suitable bearing connects the end of the ball screw to the end plate 44. In this embodiment, the end plate 44 has a bore or recess that retains the end of the ball screw and support bearing. The bore in the end plate may be established to be concentric with the ball screw aligned along axis Zs. In alternate embodiments, the recess or any other retention mount for holding the end of the ball screw on the end plate may be variably adjusted to be concentric with the ball screw.

Figure 6A:
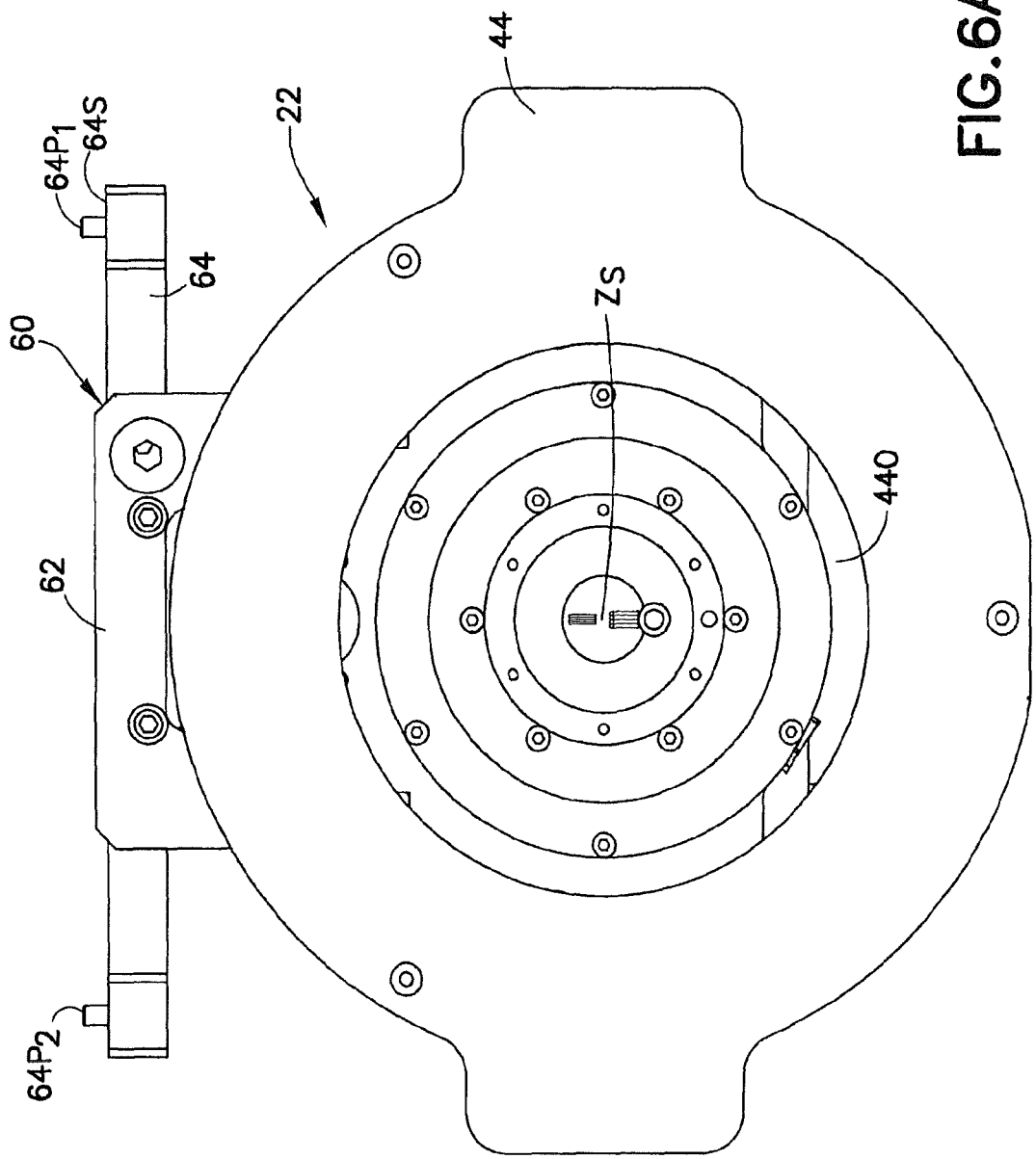
FIG. 6A is a top plan view of the support structure in FIG. 5A showing a mounting system of the support structure.
Figure 6B:
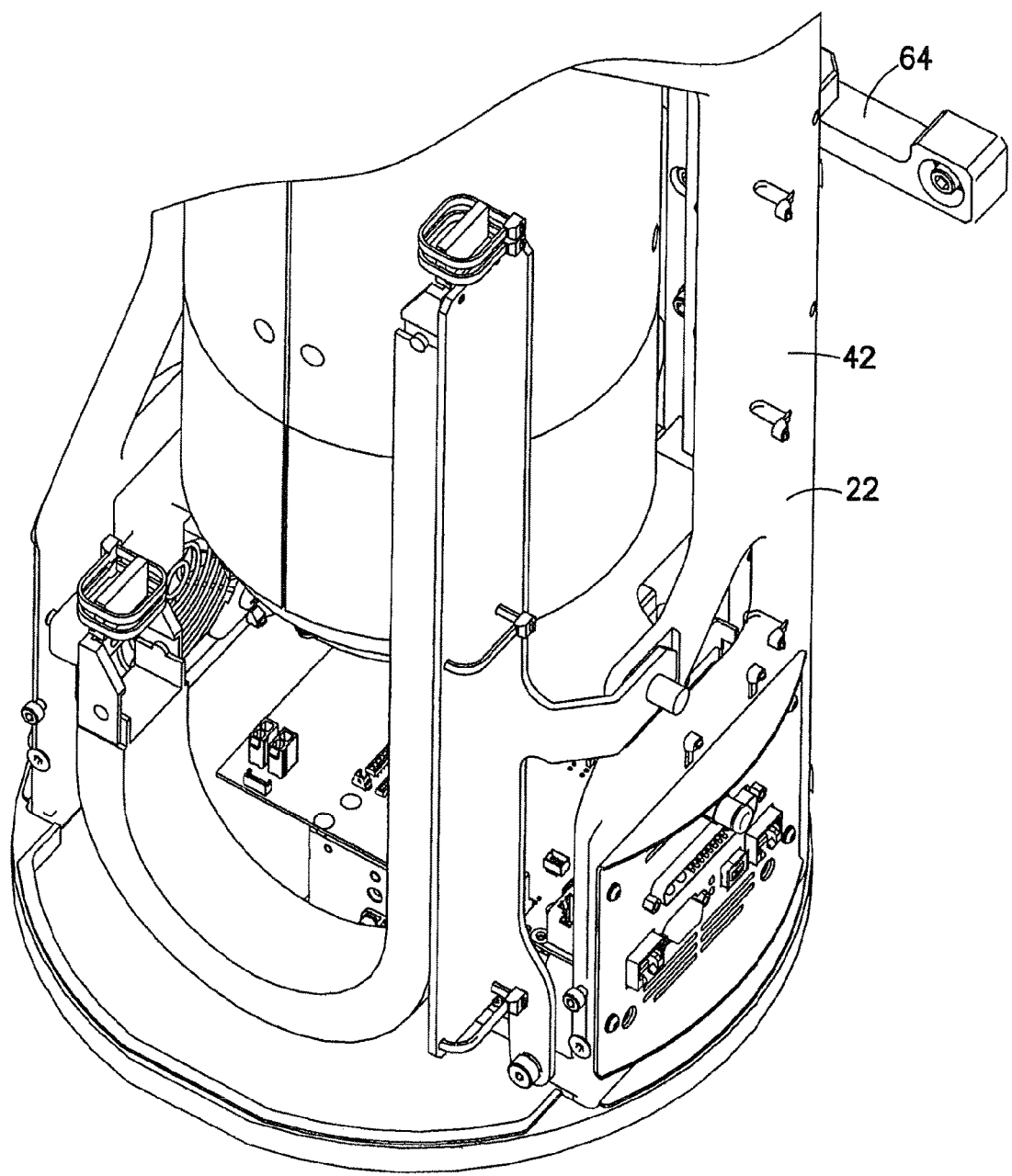
FIG. 6B is an enlarged partial perspective view of the support structure in FIG. 5A.

As seen in FIG. 5C, the backside 42S of the spine member has mounting system 60 used for mounting the transport apparatus 20 to the front section 12 of the processing apparatus 10 (e.g. directly to the structure of the front section or to the traverser). The mounting system 60 on the side of the spine member serves as the sole mounts connecting the transport apparatus 20 to the traverser/front section structure. Thus as may be realized further improves maintaining the alignment of the drive axis, and hence of the substrate transport plane of the transport apparatus, during operation of the transport apparatus, because of the highly rigid structure spanning between the drive system components to the mounting system 60. The mounting system 60 may comprise a kinematic coupling that is deterministic in positioning the support structure 22, and hence the apparatus 20, in a desired location and with a desired orientation relative to the reference frame of the front section 12. As may be realized, the position deterministic features of mounting system 60 may be established to have a desired relation to the Z axis and $T_1$ axis (see FIG. 1) of the transport apparatus (as will be seen further below the positioning $T_1$ axis may be related or based from the $Z_s/Z_1$ axis, and in combination with the high rigidity of the interposing structure, e.g. the spine member 42, between the drive section 38 establishing axis $T_1$ and mounting system 60, this may allow setting the deterministic features relative to the $Z_s/Z_1$ axis to ensure that the $T_1$ axis is in the desired position relative to the reference frame of the front section when the apparatus 20 is mounted). A suitable example for setting the deterministic features of mounting system 60 with respect to desired axes of the drive system 26 (e.g. Z-axis, $T_1$ axis) or with respect to the substrate transport plane is disclosed in U.S. patent application Ser. No. 11/154,787, filed Jun. 15, 2005 and incorporated by reference herein in its entirety. Accordingly, the position deterministic features of the mounting system 60, on different transport apparatus similar to apparatus 20, may be repeatably established in a desired known relation to the drive axes of each such apparatus, so that there is substantially no significant variance between different apparatus. In this embodiment, the mounting system 60 has an upper support shelf 62 and lower mount support 64. FIG. 6A is a top plan view of the support structure and shows a top view of the support shelf 62 and lower support 64 FIG. 6B is an enlarged partial perspective view of the support structure 22 in which the lower support 64 is partially visible. The configuration of the upper and lower supports 62, 64 of the mounting system is merely exemplary and in alternate embodiments the supports of the support structure mounting system may have any desired configuration. In this embodiment, the upper support shelf 62 and lower support 64 are generally flanges, that may be integrally formed with the unitary construction spine member 42. The upper support shelf 62 and lower support 64 are cantilevered outward from the backside 42S of the spine member 42. As seen best in FIG. 5D, the upper support shelf 62 and lower support are vertically offset from each other. The vertical offset distance between upper support shelf and lower support may be set so that the CG of the drive section 26 and the movable arm 24 assembly is located between the upper and lower supports regardless of the Z position of the movable arm 24 and carriage 55. As seen in FIG. 5C, in this embodiment, the upper support shelf has a seating surface 62S. The seating surface 62S may be located in a recess 62R in the support shelf flange. The recess 62R may be sized to receive a conjugal section (not shown) of a mating support (not shown) of the front section structure. The upper support shelf may also have a position determining feature such as a pin 62P (that may be provided by a suitable fastener). The pin 62P may interface with a hole or slot (not shown) in the mating support (not shown) of the front section 12 to define or lock the position of the apparatus 20 in either the X or Y direction or both the lower support 64 may have a vertical contact surface 64S as shown in FIGS. 5C and 6A. The contact surface 64S may abut a mating surface (not shown) on the front section structure to restrain the apparatus 20 in the Y direction. The lower support may also have position determining pin 64P1, 64P2 (formed also for example by suitable fasteners). The positioning pins 64P1, 64P2 may be located at opposite end of the lower support as shown in FIG. 6A, or may be located at any other desired location. The pins 64P1, 64P2 may serve to lock the apparatus in the Z direction by engaging receiving apertures in mating structure (not shown) of the front section 12. As may be realized, the interface between the positioning pins 62P, 64P1, 64P2 and mating structure is configured to avoid creating any over constraints. Accordingly, the positioning pins 62, 64P1, 64P2 cooperate (provide 3 points) to define the mounting plane of the apparatus 20 relative to front section reference plane.

Referring again to FIGS. 5C-5D, the Z-drive section 34 of drive system 26 has carriage 50 carriage 50 has a frame, chassis or casing 70. Platens 26P (see also FIG. 5B) are connected to the carriage casing 70 allowing the carriage to slide along rails 26R along the Z-axis of the apparatus as previously described. As seen in FIG. 5C, the carriage casing 70 may be connected to the ball screw slide 56. As may be realized, rotation of the ball screw 52, by motor 54, causes the ball screw slide 56 (that is held rotationally fixed by the casing 70) to move axially along the ball screw along the Z-axis of the apparatus. The carriage casing 70 is thus along the Z-axis under the impetus of the ball screw slide 56. As noted before, in this embodiment, the drive section 34 (driving rotation about the $T_1$ or shoulder axis) is mounted to carriage 50. Drive section 34 may comprise a motor 72 and shaft assembly 74. The motor $T_2$ in this embodiment, may be housed or otherwise located inside the carriage casing 70. In alternate embodiments, the motor power in $T_1$ axis rotation may be mounted in any other desired manner to the Z-axis carriage. The motor 72 may be any suitable motor such as brushless DC, AC or stepper motor. In this embodiment, the motor stator 72S is fixedly connected to the casing 70. The motor rotor 72R is fixedly mounted to shaft 76 of shaft assembly 74. Shaft assembly 74 generally comprises shaft 76, bearing(s) 78, slip ring 80 and encoder 82. In this embodiment the shaft assembly 74 is also located inside carriage casing 70 as seen in FIG. 5D. In alternate embodiments, the shaft assembly may have any other suitable mounting arrangement. Shaft 76 is rotatably held in the casing 70 by bearing 78 and thus the alignment of the shaft axis is established as shown. The casing 70 has a bore 70B that receives bearing 78 in a force fit. As may be realized, the casing 70 attitude may be controlled, such as by a suitable adjustment device for example using variable shims between casing and platens 26P so that the bore centerline is parallel or true to the $Z_s$ axis of the frame structure 22 (or Z-axis of the apparatus). A fixture may be used to set the alignment of the carriage bore centerline, as described in aforementioned U.S. patent application Ser. No. 11/154,787 to provide repeatability in alignment of different transport apparatus similar to apparatus 20. Shaft 74 mounted by bearing 78 in casing 70 is thus aligned with the bore centerline, and thus is substantially parallel with the Z-axis of the apparatus. The axis of rotation of shaft 76 is the shoulder axis of rotation $T_1$, and as described above the rotation axis $T_1$ is established true to the z-axis (the axis of linear position of the arm). Moreover, here again it may be realized that static and dynamic loading conditions generated during motions of the apparatus 20 or of the traverser (not shown) in the event the apparatus is on a traverser, will not generate appreciable misalignment between the $T_1$ axis and Z-axis because the alignment of these axes is set by a common rigid member; spine member 42 of the support structure (i.e. $T_1$ axis is directly dependent on spine member, and Z-axis is defined by spine member as described before). This ensures that all motions (Z, θ, R) of the apparatus end effectors 32A, 32B (see FIG. 2) are always predictable and repeatable. Encoder 82 may be mounted onto shaft 76, and is communicably linked to the controller 40D (see FIG. 1) to provide desired control of motor 72. Shaft 76 may be hollow. The slip ring 80 may be mounted to shaft 76. The slip ring is connected to a suitable power, and signal coupling on the casing 70 for providing power and communication to devices on the arm 24. As seen in FIG. 5D, the shaft assembly 74 also may have a pneumatic feed line 84. The pneumatic feed line 84 may extend through interior of shaft 76 to a feed port. The casing 70 may have a suitable pneumatic coupling mated to the feed port on the shaft assembly to a pneumatic feed and allow continuous rotation of the shaft 76 (and hence continuous rotation of the arm about the shoulder joint axis $T_1$).

Figure 7:
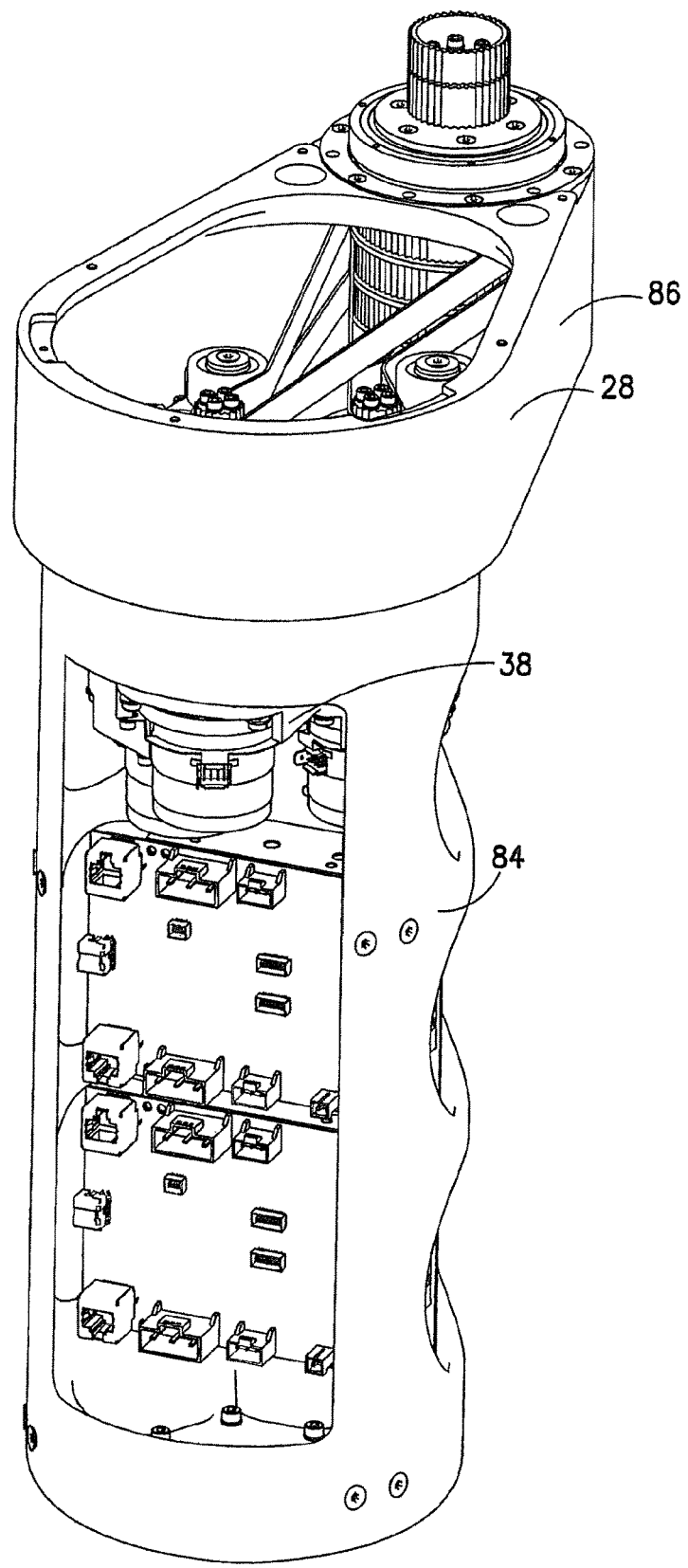
FIG. 7 is a perspective view of an upper arm and a portion of the drive system of the substrate transport apparatus in FIG. 2.
Figure 7A:
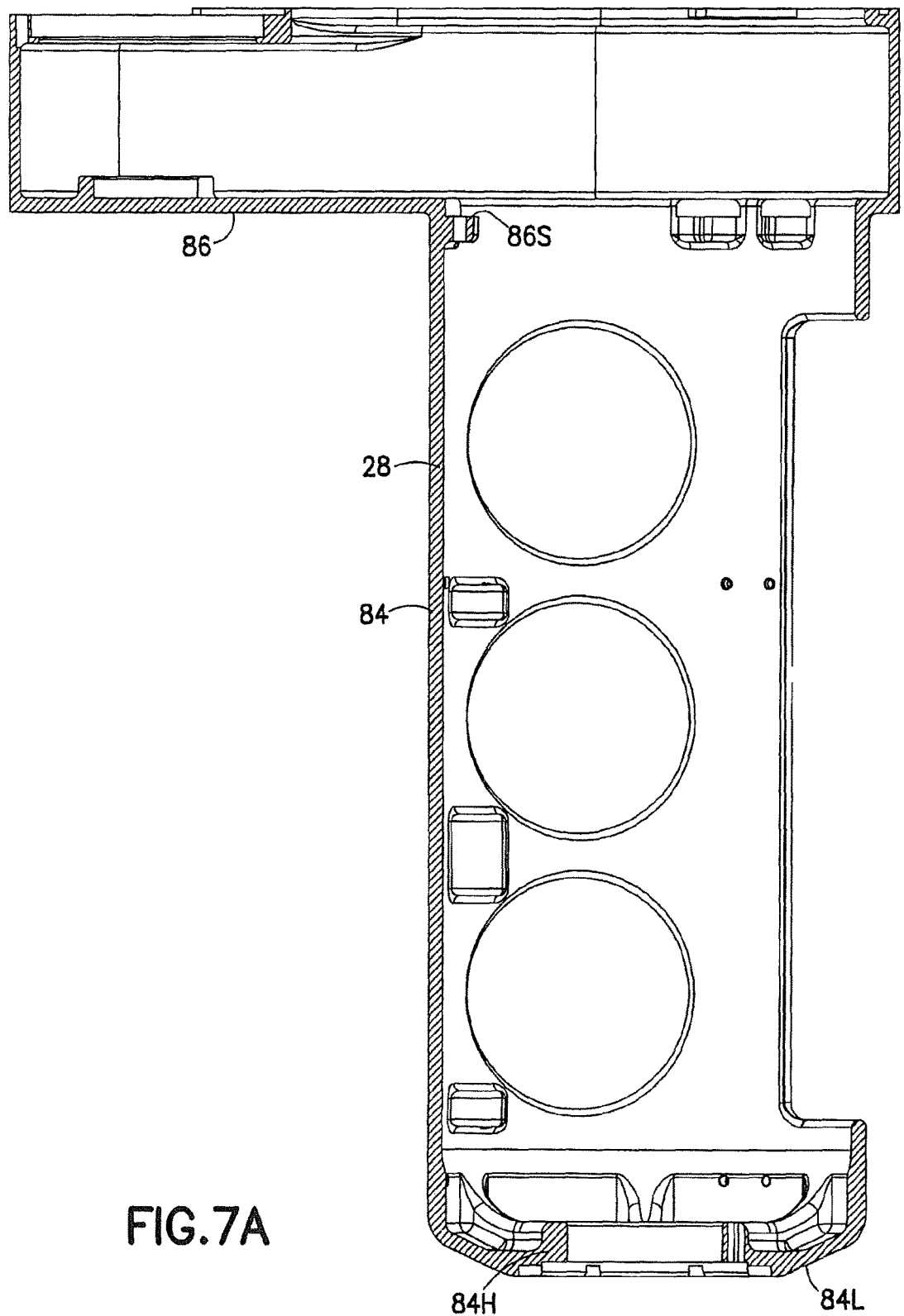
FIG. 7A is a cross section view of the upper arm shown in FIG. 7.
Figure 7B:
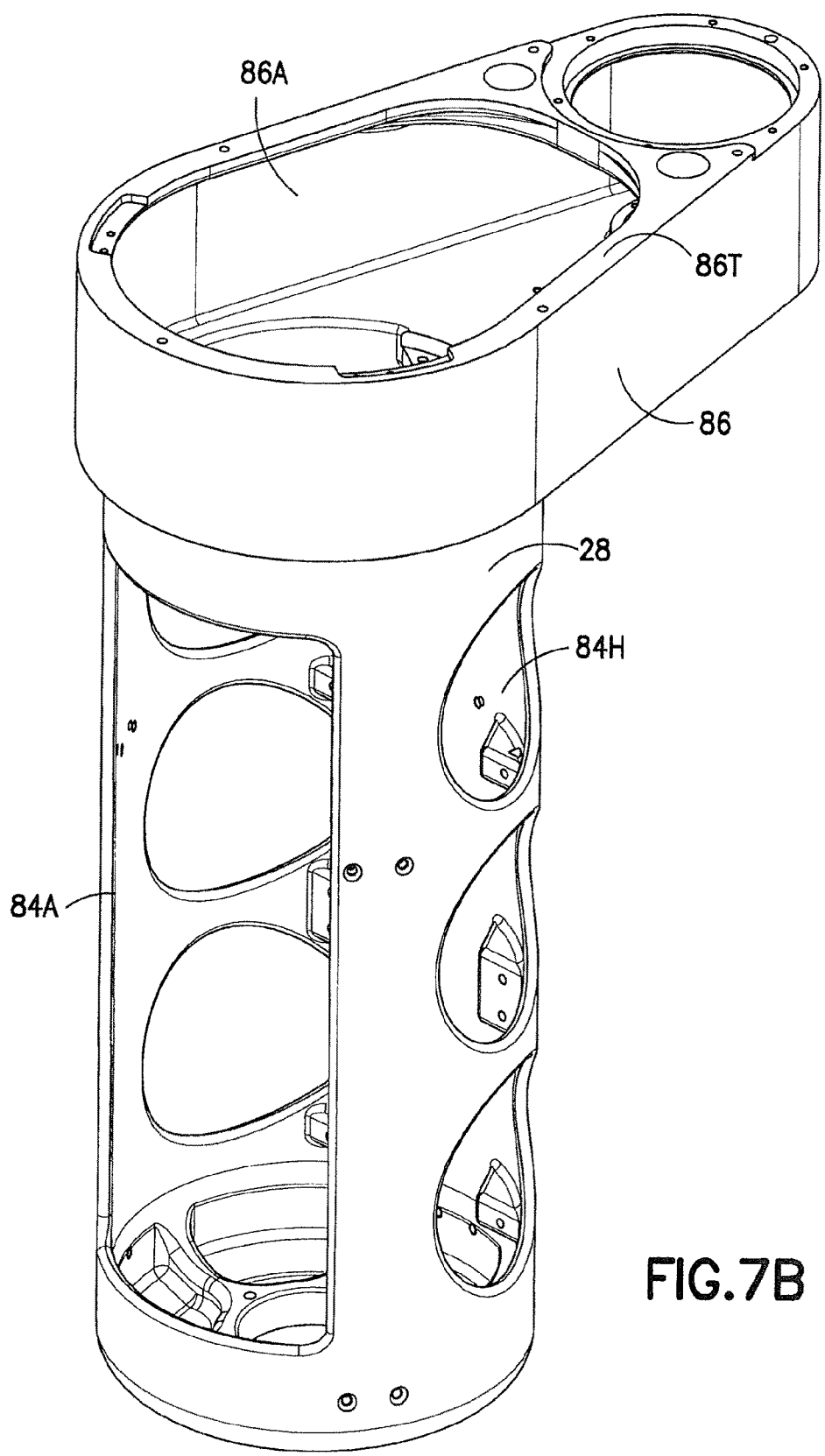

Referring now again to FIGS. 4A, 4B, arm assembly 24 is mounted to carriage 50. In particular, upper arm 28 of the arm assembly 24 is mounted to the end 76E of the shaft 76 mounted in carriage 50 (see also FIG. 5D). FIG. 7 is a perspective view of the upper arm 28 of arm assembly 24. FIG. 7A is a cross-sectional view, and FIGS. 7B and 7C are respectively top and bottom perspective views of the upper arm 28 as shown, in this embodiment the upper arm has a lower section or turret 84 and upper section 86. The turret 84 has a hollow generally cylindrical shape. The upper section 86 depends from the turret 84 as shown. The upper arm 28 is a one-piece member (or may also be referred to as being of unitary construction) and the turret 84 and upper section 86 are integrally formed in the unitary construction upper arm 28. The upper arm 28 may be formed by casting, forging or any other suitable formation process. The upper arm may be made of metal, such as aluminum alloy, stainless steel or from non-metallic materials such as plastic, ceramic or composites. In alternate embodiments, the turret and upper section of the upper arm may have any other suitable shape. As seen in FIG. 7B, the upper section has an access way or aperture 86A in the top 86T. The access way 86A may have any suitable shape, and is sized to allow ready access to an operator to components in the upper arm 28 as will be described further below. The turret 84 may also have an access way(s) 84A formed therein for access to components interior to the turret 84. In this embodiment, the access way 84A in turret 84 is shown located on a side of the turret generally opposite the direction in which upper section 86 projects from the turret. In alternate embodiments, the access way(s) in the turret may be located on any desired side(s) suited for accessing components interior to the turret. As shown in FIG. 7B, turret 84 may have other opening(s) 84H to lighten the turret or for access as desired. Outer covers 28C (see FIG. 4A) may be mounted to close the turret 84. The bottom end 84L of the turret 84 may have a mounting hub or coupling 84H for connecting the upper arm to the end 73E of $T_1$ rotation shaft 76 in the carriage 50. As seen best in FIGS. 7A and 7C, the mounting coupling 84A of the turret 84 has mounting surfaces arranged to generally conform to the end 76E (see also FIG. 5D) of shaft 76. When mounted to the shaft 76, the turret 84 extends through opening 44D (see also FIGS. 5C and 6A) in the upper end plate 44 into the space 22S (see FIG. 5A) defined by support structure 22. The turret coupling 84H is attached to the end 76E of shaft 76 by suitable fasteners capable of transmitting the shear and axial loads across the turret to shaft coupling. The upper arm 28 is shown in its mounted position in FIG. 4B. Upper arm section 86 is located over end plate 44. As may be realized, upper arm 28 may be continuously rotated about axis $T_1$ (see FIG. 2) by shaft 76. The unitary construction upper arm 28, with integral turret 84 and upper arm section 86 eliminates a coupling connection that simplifies assembly of the movable arm 26. Moreover, the turret 84, having a much larger torsional area, in comparison to shaft 76, enables the $T_1$ drive section motor 74 to be mounted low (i.e. inside the Z-carriage) in the support structure, for achieving a low apparatus 66 and reducing overturning moment on the apparatus mounts, while keeping the drive shaft 76 short, for reduced shaft flexing and improved movement accuracy of the arm.

As seen in FIG. 4B, the drive system 26 has a drive module 38 that is removably attachable to the arm 24. The drive module 38 is interchangeable with a number of substantially similar drive modules 38A (schematically illustrated in FIG. 4B) that have different drive characteristics as will be described in greater detail below. The drive module 38 is seen best in FIG. 9. The drive module 38 generally has a casing and a motor cluster 92. The motor cluster 92 is located in the casing 90. The casing 90 mounts the drive module 38 to section 86 of the upper arm 28 (see also FIG. 8 which is a plan view of the upper arm section 86). In the exemplary embodiment, the motor cluster 92 includes three (3) motor assemblies 94A, 94B, 94C. In alternate embodiments, the motor cluster may have more or fewer motor assemblies. Other interchangeable modules 38 of the drive system may have a motor cluster 92A with two (2) or one (1) motor assemblies similar to assemblies 94A, 94B, 94C. Each motor assembly 94A, 94B, 94c is substantially similar in this embodiment. Hence, the motor assemblies 94A, 94B, 94C are themselves interchangeable. As motor assemblies 94A, 94B, 94C are substantially similar, the motor assemblies will be described in greater detail below with particular reference to motor assembly 94A. Motor assembly 94A has a motor 96A and shaft 98A. The motor 96A may be a brushless DC, AC or stepper motor, or any other suitable type of motor. The motor assembly 94A may be removable as a unit from casing 90. In alternate embodiments, the motor and shaft may be separately removable from the module casing. Motor assemblies 94A, 94B, 94C are positioned in the module casing 90 as shown. In this embodiment, the casing 90 may have housings 90A, 90B, 90C for each motor assembly 94A, 94B, 94C. By way of example, casing 90 may have a motor assembly housing 90A for $T_2$ motor assembly 94A (i.e. the motor assembly 94A for driving independent rotation about $T_2$/elbow axis shown in FIG. 2), housing 90B for $W_1$ motor assembly 94B (i.e. the motor assembly 94B for driving independent rotation about $W_1$/wrist axis, shown in FIG. 2) and housing 90C for the second $W_1$ motor assembly 94C (i.e. the motor assembly 94C for driving second end effector independent rotation about $W_1$/wrist axis). In alternate embodiments, the module casing may be shaped to form a common housing for the motor assemblies of the motor cluster, or may have any other desired arrangement. As maybe realized, in other interchangeable modules similar module 38A, with fewer motor assemblies (for independently driving independent rotation about fewer axes of rotation), one or more of the housing, similar to housings 90A-90C, may not have a motor assembly located therein. For example, in the case of a drive module 38A with no second $W_1$ motor assembly, the motor assembly housing (similar to housing 90C) for housing the second $W_1$ motor assembly would be empty. In alternate embodiments where the motor cluster has more than three motor assemblies (described here for example purposes only) the module casing may be provided with more motor assembly housings. In other alternate embodiments, the module casing may have housings specific to the number of motor assemblies to be provided in the drive module. Thus, for example, for three motor assemblies there would be three corresponding housings, for two motor assemblies. There would be two corresponding housings, and so on. In this case, the module casing, and hence the module, would still be interchangeable; the module casing of each the different interchangeable modules having similar general configuration and mounting features for mounting the module to the upper arm 28.

As may be realized from FIG. 4B, the configuration of the movable arm assembly 24 may be selected by selecting the module 38, 38A with the motor cluster 92, 92A having the desired number of motor assemblies, to provide the arm with the desired number of independent axes of rotation. By way of example, movable arm 26 is shown having (in addition to axes $T_1$ and Z) three (3) independent axes of rotation (e.g. independent rotation of forearm link 30 about axis $T_2$, independent rotation of both end effectors 32A, 32B about wrist axis $W_1$). Accordingly, to provide arm assembly 26 with three (3) independent axes of rotation, drive module 38 is selected for installation. If it is desired to provide the movable arm 26 with two or one independent axis of rotation, then an interchangeable drive module 38A with motor cluster 92A having a corresponding number of motor assemblies may be selected for installation in upper arm 28.

As noted before, the configuration of the module casing 90 shown in the drawings is merely exemplary, and in alternate embodiments the module casing may have any other desired configuration. Casing 90 may have a mounting flange(s) 90F for attaching the module 38, 38A to the upper arm 28. In this embodiment the mounting flange(s) project outwards and define seating surfaces 90S (see FIG. 9) that overlap conformal mating surfaces 86S (see FIG. 7A) located inside the turret 84 of the upper arm. As may be realized from FIGS. 7A and 9, and as seen in part in FIG. 7, when mounted to the upper arm, the drive module 38 is located in the turret 84 of the upper arm. In alternate embodiments, the module casing may have mounting features of any other desired configuration. When mounted in the upper arm 28, the shaft ends of the motor cluster shafts 98A-98C are located in the upper arm section 86. As seen in FIG. 9, in this embodiment the module casing housings 90A-90C, are vertically staggered relative to the mounting flange 90F. The vertical stagger of the housings 90A-90C, positions the toothed pulleys 110A-110C (see FIG. 8) on the ends of the corresponding shafts 98A-98C, at a commensurate vertical spacing to allow each pulley to be connected to a corresponding transmission 112, 114, 116. Hence, as noted before, the substantially identical motor assemblies 94A, 94B, 94C of the module 38, 38A are entirely interchangeable and may be swapped with each other and each may be located in any of the housings 90A, 90B, 90C without differentiation and without modification. In this embodiment, the standoff of each corresponding end of shaft pulley 110A, 110B, 110C above the top of the corresponding housings 90A, 90B, 90C is the same. As seen in FIG. 9, in this embodiment, the housing 90 for the $T_2$ motor assembly 94A is located highest, with housing 90B for the $W_1$ motor assembly 94B (driving end effector 32A) in the middle, and housing 90C for the second $W_1$ motor assembly 94C (driving end effector 32B) lowest.

Figure 8:
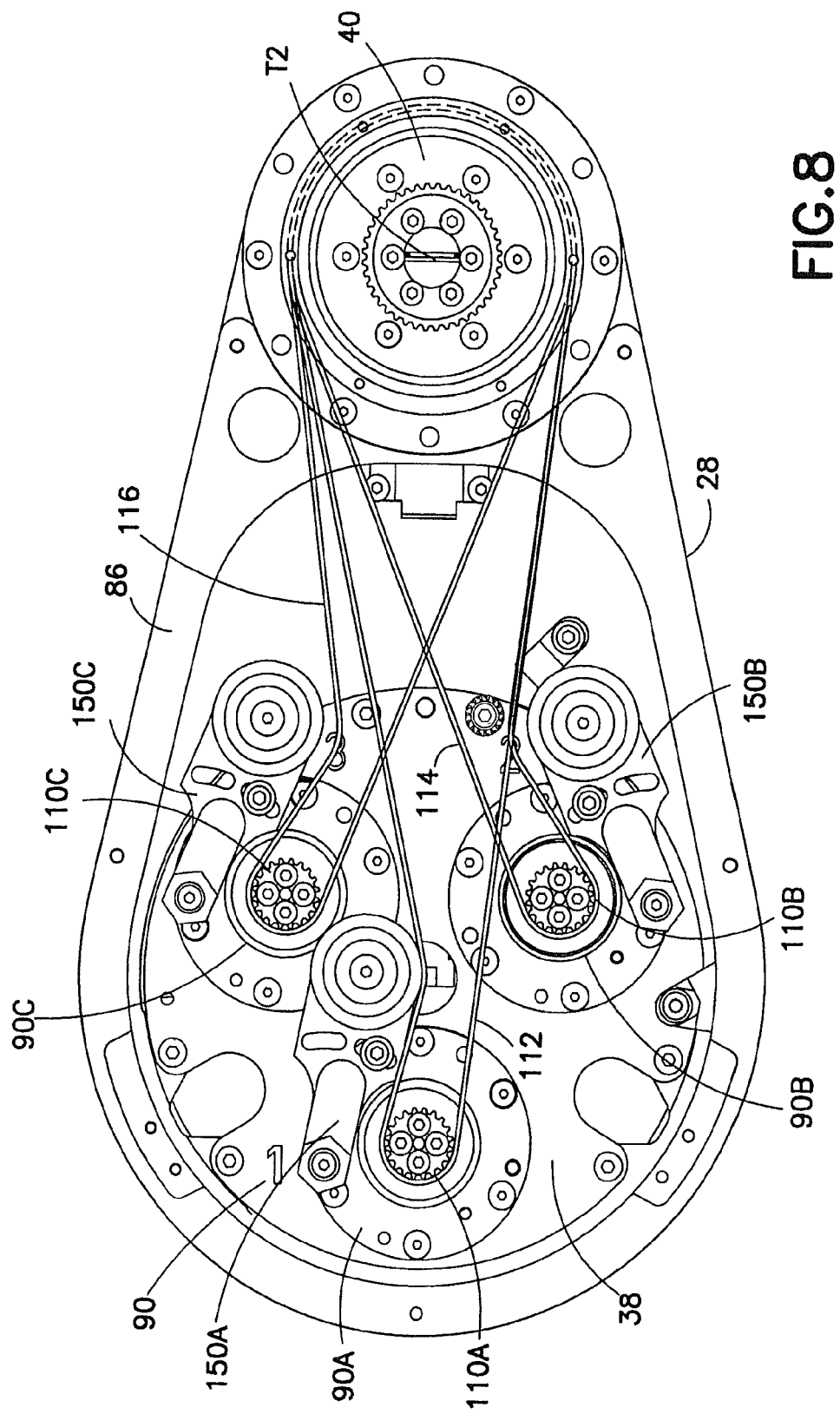
FIG. 8 is a top plan view of the upper arm section and the portion of the drive system shown in FIG. 7.
Figure 9:
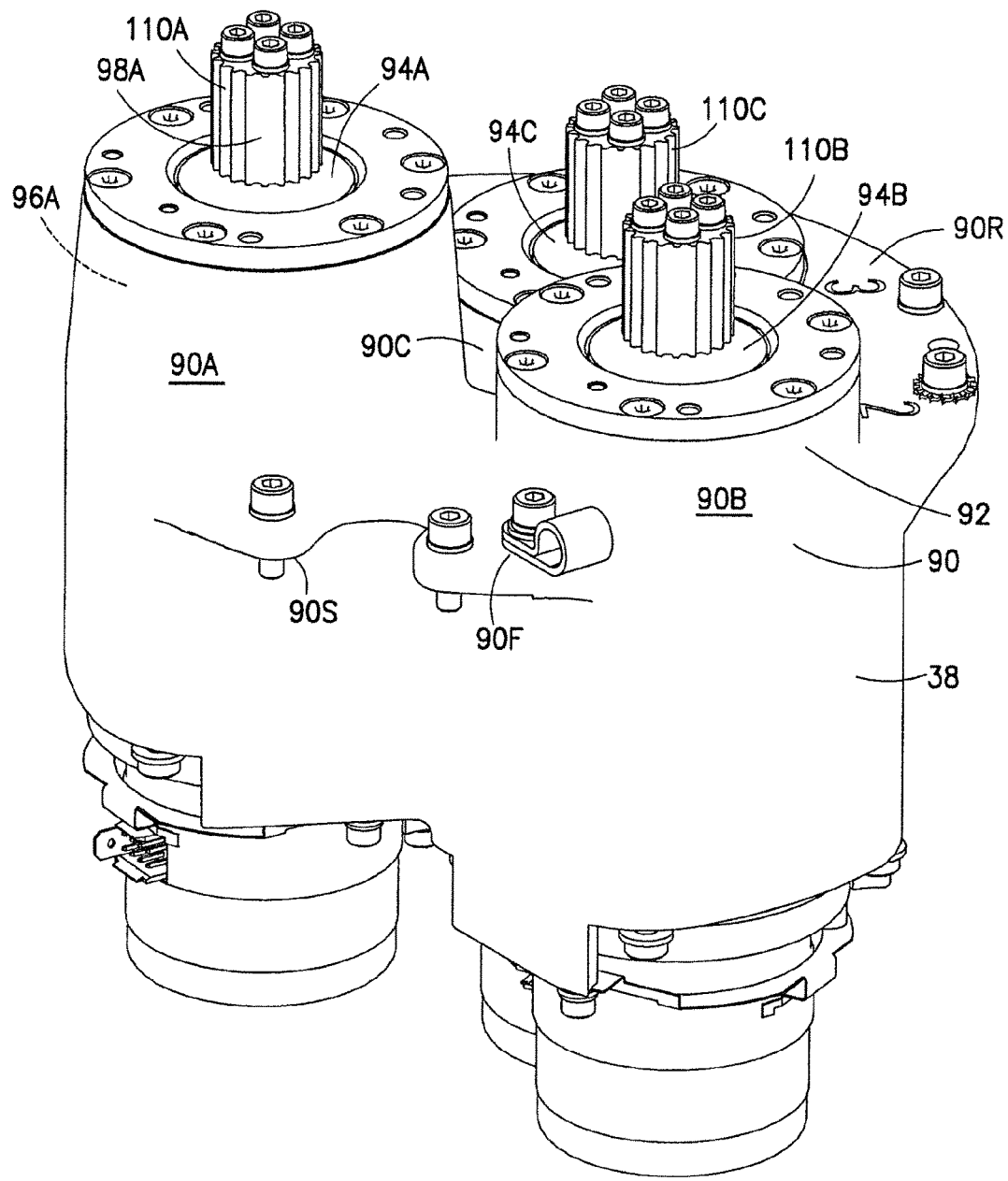
FIG. 9 is a perspective view of a drive system module of the substrate transport apparatus shown in FIG. 2.
Figure 10A:
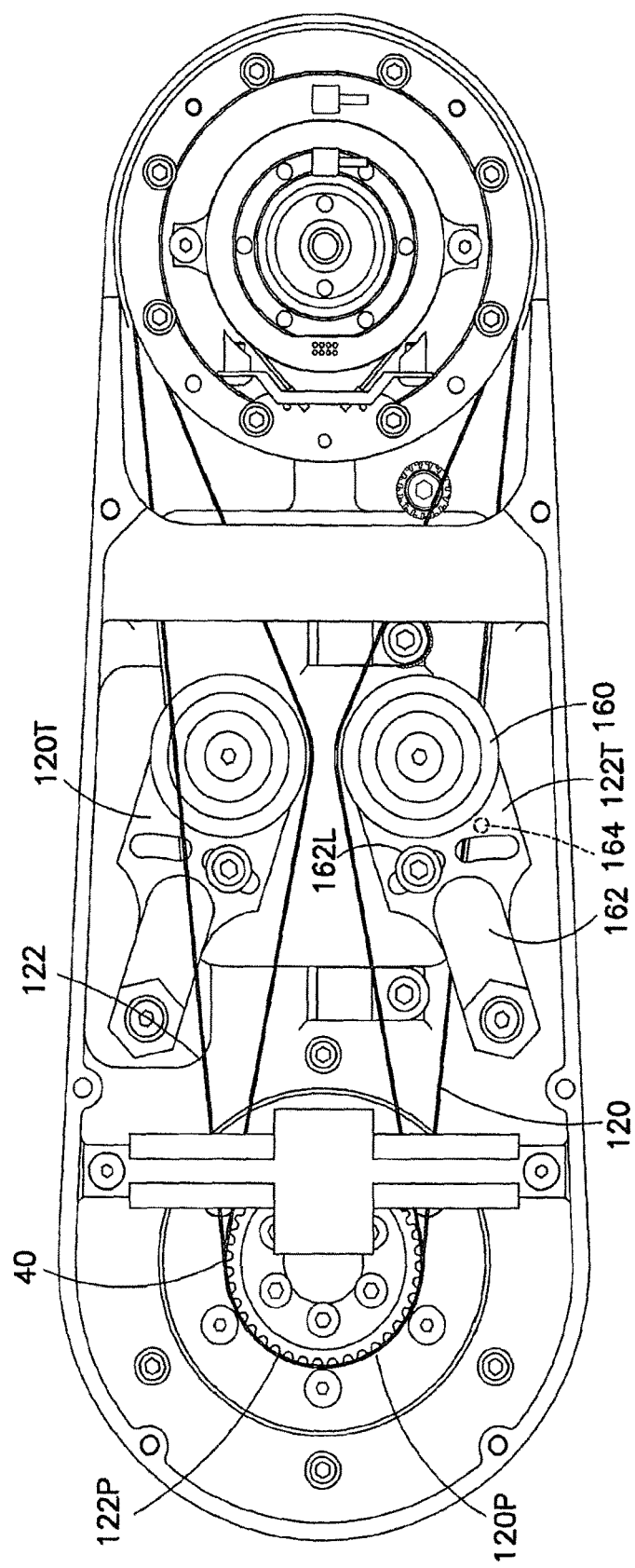
FIG. 10A is a top plane view of the forearm in FIG. 10.
Figure 11:
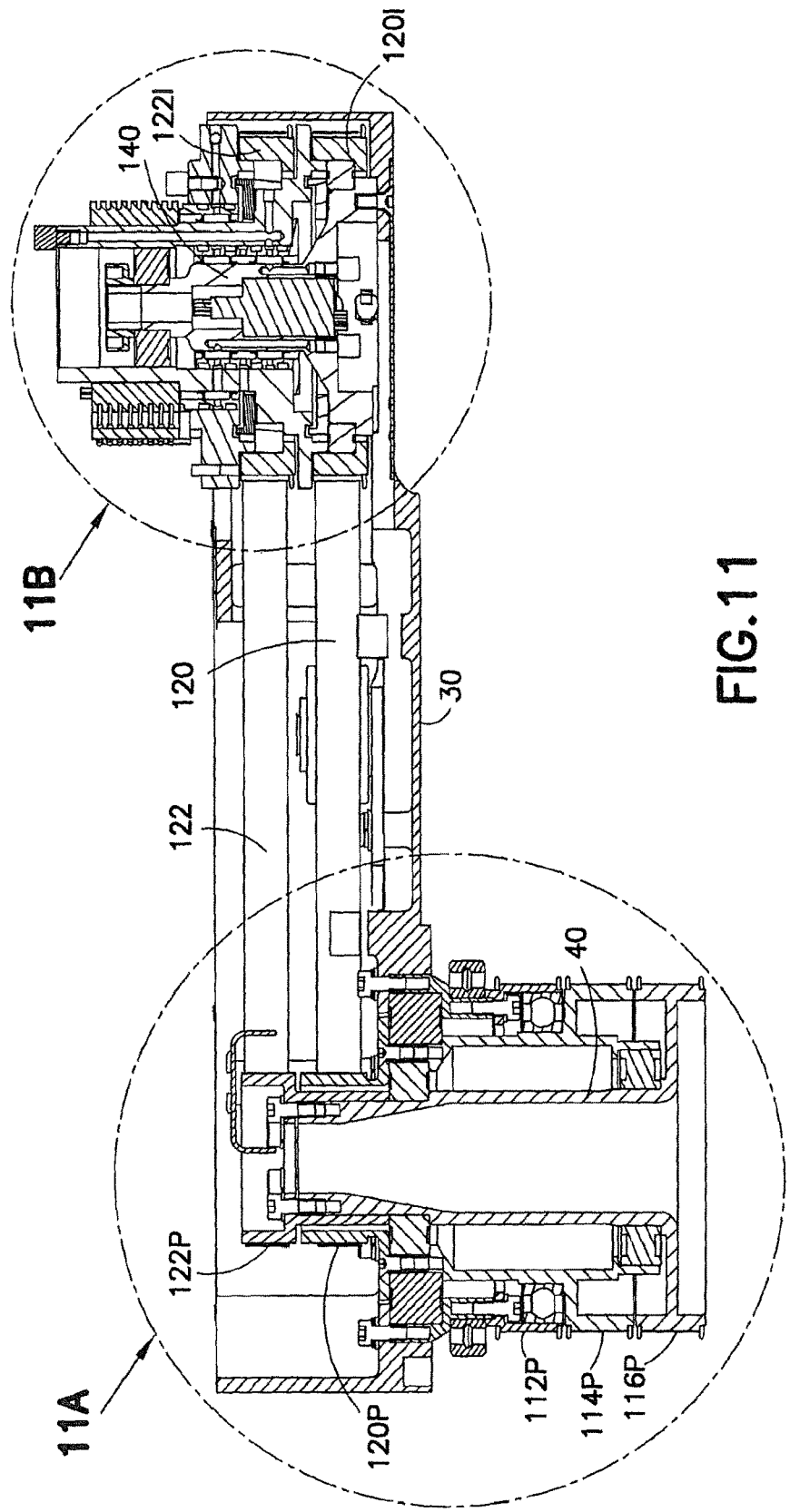
FIG. 11 is a cross-sectional view of the forearm in FIG. 10.
Figure 11A:
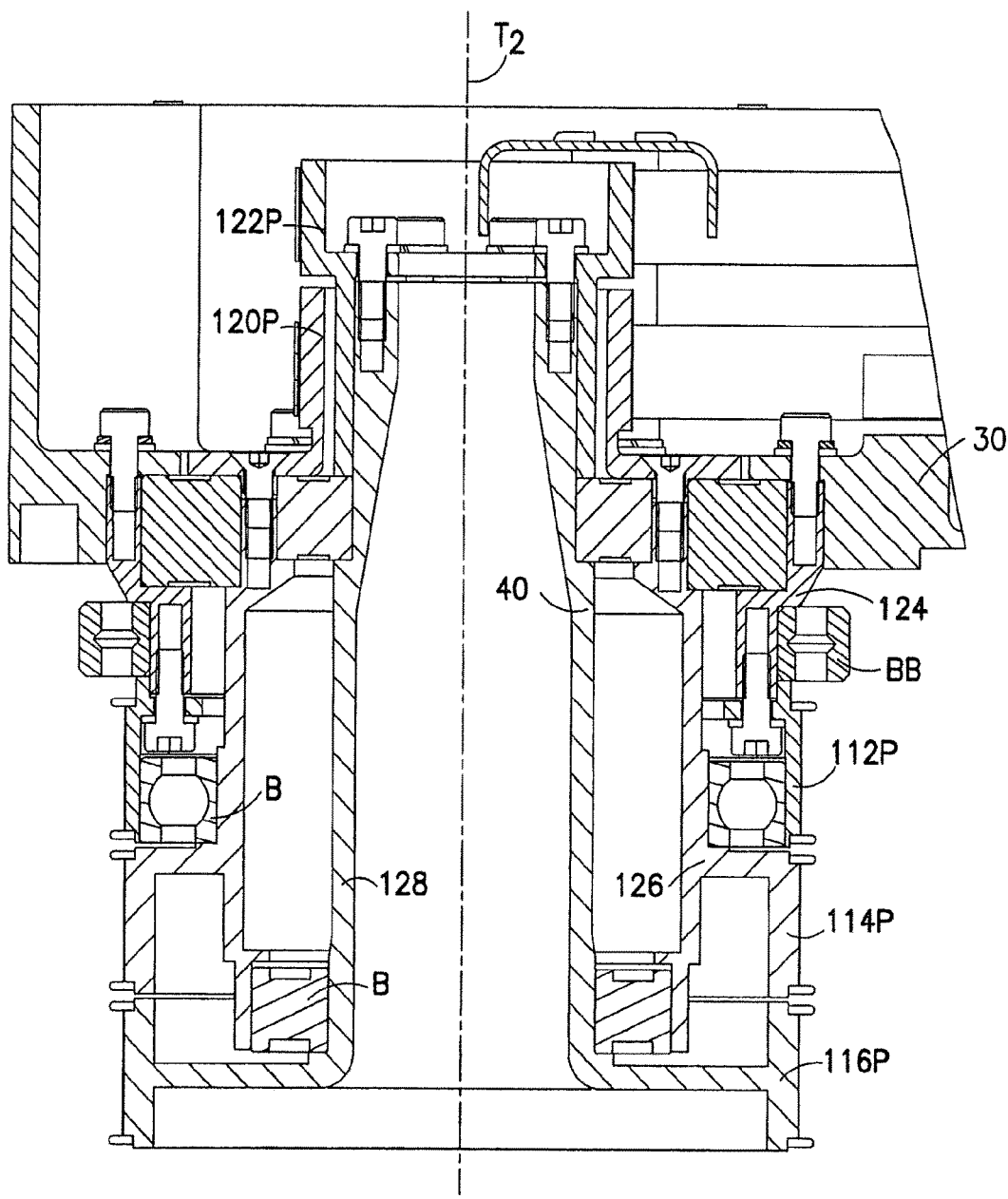
FIG. 11A is a partial cross-sectional view of a shaft system at an elbow joint of the forearm.

Referring now to FIG. 8, there is shown a top plan view of the upper arm 28. As seen in FIG. 8, coaxial shaft assembly 40 is mounted to the outward end of upper arm 28. As noted before, the forearm 30 is pivotally mounted to the upper arm 28 by coaxial shaft assembly 40. Coaxial shaft assembly defines the elbow axis of rotation $T_2$. FIGS. 10-10A are respectively a perspective view and top plan view of the forearm 30. Referring also to FIGS. 11-11 there is shown respectively a cross-sectional view of the forearm 30 and a cross-sectional view of the coaxial shaft assembly 40. As seen best in FIG. 11A, coaxial shaft assembly 40 in this embodiment includes three concentric shafts 124, 126, 128. The shafts 124, 126, 128 are radially supported respectively from each other, by suitable bearings B, in a generally nested arrangement. Outer shaft 124 is radially held in the upper arm by bearing BB. The shafts 124, 126, 128 of the W-axial shaft assembly 40 are capable of rotating about the common axis of rotation $T_2$. In alternate embodiments, the coaxial shaft assembly may have more or fewer coaxial shafts. As seen in FIG. 11A, the outer shaft 124 is fixed to the forearm 30 so that forearm and shaft 124 rotate as a unit about axis $T_2$. Outer shaft also has an idler pulley 112P for transmission 112 (in this embodiment an endless loop transmission though any suitable transmission may be used) fixed thereon. Idler pulley 112P and shaft 124 rotate as a unit. Middle shaft 126 has an idler pulley 114P fixed thereon. Middle shaft 126, in this embodiment is shown as a one-piece member with integral pulley 114P, though in alternate embodiments the idler pulley may be fixed to the shaft in any suitable manner. Idler pulley 114P is part of transmission 114, which in this embodiment is also an endless loop. Middle shaft 126 is fixedly joined at its upper end to intermediate transfer pulley 120P. Thus, shaft 126 and the pulleys fixed thereto, idler 114P, and transfer 120P rotate as a unit. The reduction ratio between idler and transfer pulley may be about 2:1 though any other desired ratio may be used. The inner shaft 128 has idler pulley 116P fixed thereon for transmission 116. Shaft 128 may also be a one-piece member with integral idler pulley 116P. Shaft 128 has transfer pulley 122P fixed to its upper end as shown. Thus, shaft 128 and pulleys 116P, 122P fixed thereon rotate as a unit. As seen best in FIG. 8, the respective drive pulleys 110A, 110B, 110C of the motor assemblies, in the motor cluster, are connected to the corresponding pulleys 112P, 114P, 116P of shaft assembly 40 by transmission belts 112, 114, 116. Drive pulley 110A is connected by belt 112 to pulley 112P, drive pulley 110B is connected by belt 114 to pulley 114P and drive pulley 110C is connected by belt 116 to pulley 116P. Belt tensioners 150A, 150B, 150C are mounted to the upper arm 28 to provide and maintain desired tension on the transmission belts as will be described further below. Thus drive pulley 110A (on motor assembly 94A) rotates forearm 30 about axis $T_2$, and drive pulley 110B (on motor assembly 94B) rotates transfer pulley 120P about axis $T_{2f}$ and drive pulley 110L (on motor assembly 94C) rotates transfer pulley 122P about axis $T_2$. In the embodiment shown, the drive to idler pulley diameter ratio may be about 1:4 though any suitable ratio may be used.

Figure 11B:
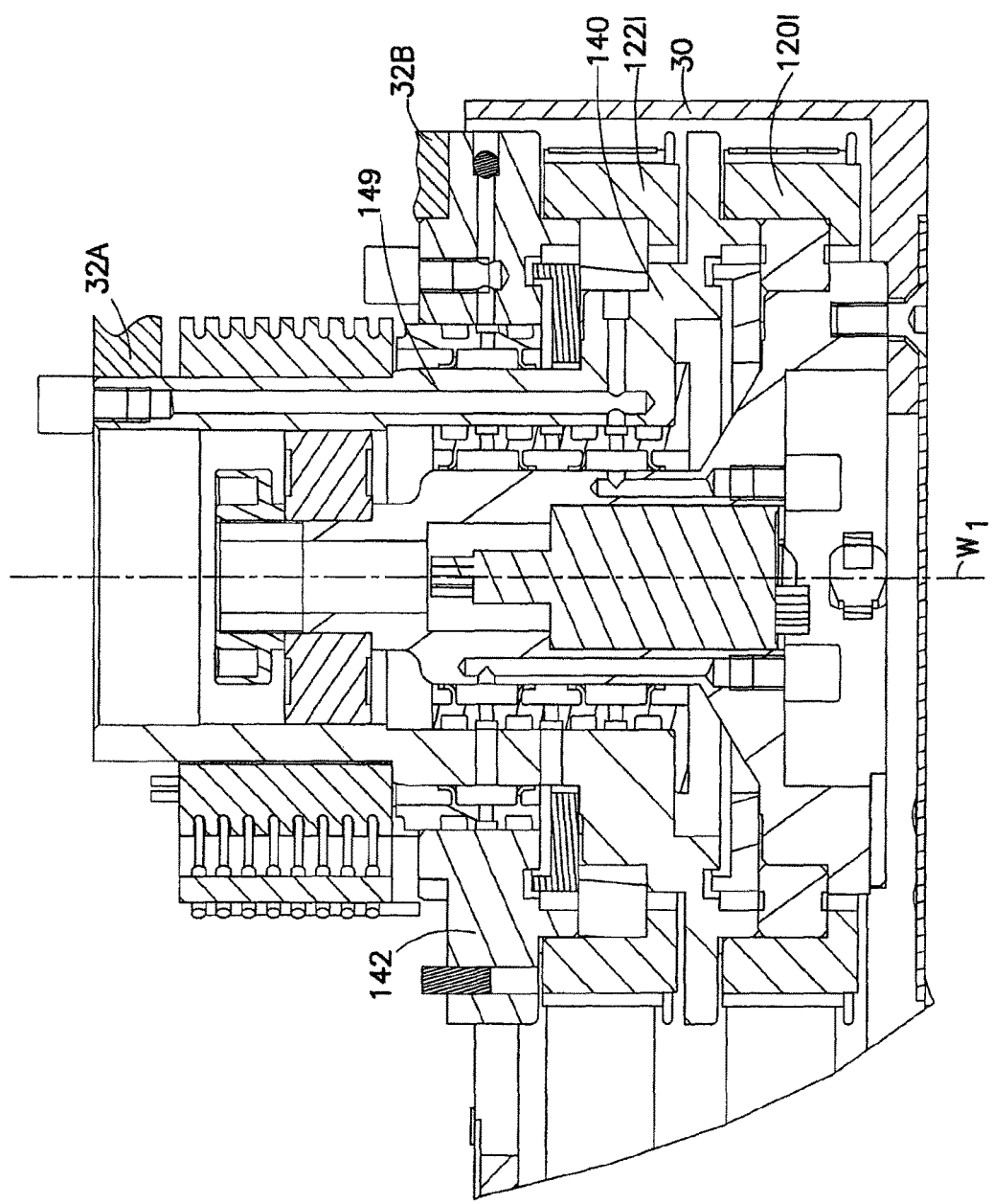
FIG. 11B is a partial cross-sectional view of a shaft system at a wrist joint of the forearm.

Referring still to FIGS. 10-10A and 11, the transfer pulleys 120P, 122P are respectively connected by transmissions 120, 122 to corresponding idler pulleys 120I, 122I and coaxial shaft assembly 140. As seen best in FIG. 11, coaxial shaft assembly 140 is held by suitable bearings on forearm 30. A cross sectional view of coaxial shaft assembly 140 is shown in FIG. 11B. Coaxial shaft assembly 140 has concentric outer and inner shafts 142, 144 that are rotatably supported to rotate about common axis of rotation $W_1$.

Figure 3A:
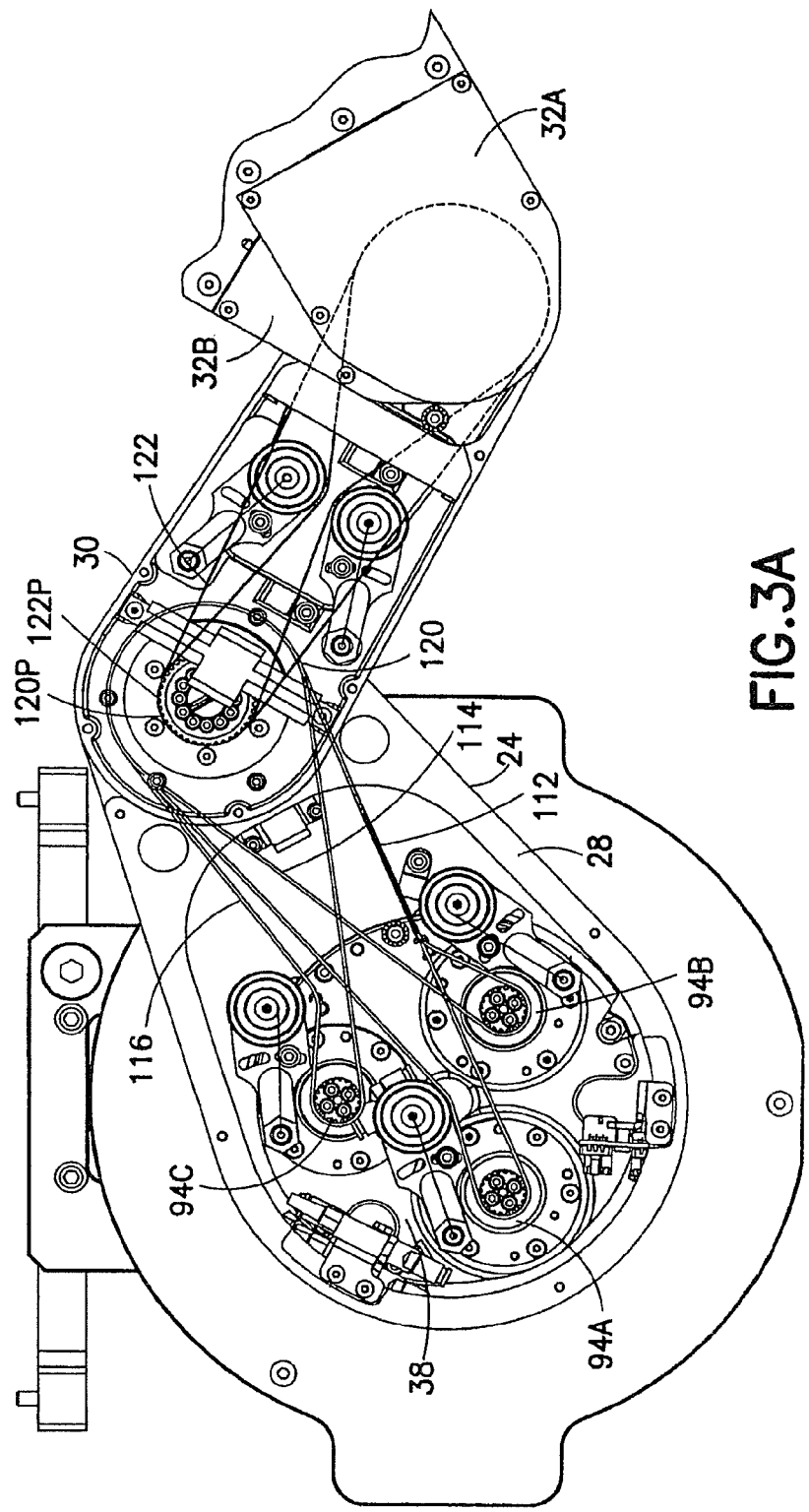
FIG. 3A is an enlarged partial plan view of the substrate transport apparatus.

Shafts 142, 144 may be provided with slip rings and pneumatic feed through so that the shafts are capable of continuous rotation. The outer shaft 142 has idler pulley 122I, for transmission 122, fixed thereon so that shaft and idler rotate as a unit. The lower end effector 32B is fixed to outer shaft 142 so that end effector 32B and shaft 142 also rotate as a unit. Inner shaft 144 as idler pulley 120I, for transmission 120, fixed thereon so that shaft and idler rotate as a unit. The upper end effector 32A is fixed to inner shaft 144 to rotate as a unit with the shaft. As seen in FIGS. 10 and 11, the transmissions 120, 122 respectively connecting transfer pulley 120P to idler 120I, and transfer pulley 122P to idler 122I, are endless loop transmission in this embodiment. In alternate embodiments, any suitable transmissions may be used. The reduction ratio between transfer 120P, 122P and idler pulleys 120I, 122I, may be about 1:2, though any desired reduction ratio may be used. As seen in FIG. 10A, tensioners 120T, 122T are mounted in the forearm and biased against transmission belt 120, 122 to generate desired belt tension. Referring now also to FIG. 3A, there is shown a top plan view of the movable arm 24 and the section of the drive system located thereon.

FIG. 3A shows the motor assemblies 94A, 94B, 94C of drive module 38, connected respectively for driving $T_2$ axis rotation via transmission 112, and independent $W_1$ axis rotation of two end effectors 32A, 32B via transmission 114, 116 and secondary transmission 122, 120. As may be realized, in the case where a drive module 38A with fewer motor assemblies is mounted in the drive system, for example having motor assemblies similar to assemblies 94A, 94C (for $T_2$ axis rotation and single $W_1$ axis rotation) and without a motor assembly similar to assembly 94B (i.e. no second independent $W_1$ axis rotation), then correspondingly fewer transmissions would be located in the arm. For example, if the drive module has no motor assembly similar to assembly 94B, then transmissions 114 and 120 would not be installed in the arm. Hence, one end effector similar to end effector 32A would not be independently rotatable about axis $W_1$ or may be removed from the arm. Thus, the arm configuration is selectable by selecting drive module 38, 38A to be installed in the drive system.

Referring still to FIGS. 3A, 8 and 10, and as noted before each transmission 112, 114, 116, 120, 122 is tensioned by a corresponding belt tensioner 150A, 150B, 150C, 120T, 122T. In this embodiment, the tensioners 150A, 150B, 150C, 120T, 122T are substantially similar, and hence will be described below with specific reference to tensioner 122T seen best in FIG. 10A. In alternate embodiments any suitable tensioner configuration may be used. Tensioner 122T generally comprises a roller 160 pivotally mounted on a movable base 162. In this embodiment, base 162 is a pivotable link pinned at one end, though any suitable movable base may be provided. The movable base 162 may also have a position lock, in the embodiment shown a friction lock 162L provided by torquing a fastener against the side of the base, to lock the base and hence the tensioner 122T in a position in which the tensioner engages and suitably tensions the corresponding transmission 122. The movable base 162 may be resiliently biased, by a spring or pneumatically (not shown) to urge the tensioning roller 160 against the transmission 122. In the embodiment shown, the tensioner 122T may include a suitable force transducer 164. The force transducer 164 may be of any suitable type such as a piezo-electric force transducer, strain gage, an electro-optical force transducer, generating a signal corresponding to a force generated by the tensioning roller 160 against the transmission belt 122. The force transducer 164 shown schematically in FIG. 10A may be mounted in any desired location on the tensioner suited to the transducer type being used. The transducer 164 is connected by suitable communication links (not shown), that may be wireless, or wired, to controller 400 (see also FIG. 1). The controller 400 has program modules 401, 404, at least one of which having suitable programming for registering the signals from the force transducer and determining from the signals the tensioning force applied by the tensioning roller 160 on the transmission 122. Further, the programming in the controller is capable of determining when the force applied by the tensioner 122T on the transmission provides the desired tension on the transmission. The controller programming may then send a command enabling an indication on a suitable user interface (not shown), for example emitting an aural tone from a sound device, or activating an indicator light on a user interface, to indicate that the desired tension on the transmission has been achieved. The movable base of the tensioner 122T may then be locked into position. This system eliminates any guess work when setting up the drive system 26 and avoids overtensioning of the transmissions. The controller 400 may also be programmed to periodically sample the signal from the tensioner force transducer for monitoring the operating status of the transmissions. The controller may be programmed with an operating range for the transmission tension, and also programmed to generate suitable indications, when the transmission tension is outside the range. Thus, a drive system health monitoring system is also provided.

While particular embodiments have been described, various alternatives, modifications, variations, improvements, and substantial equivalents that are or may be presently unforeseen may arise to Applicant's or others skilled in the in the art. Accordingly, the appended claims as filed, and as they may be amended, are intended to embrace all such alternatives, modifications, variations, improvements and substantial equivalents.

What is claimed is:

1. A substrate transport apparatus comprising:
    a frame;
    a drive section connected to the frame, the drive section including a shoulder drive section disposed in the frame and an articulated joint drive section, the shoulder drive section including a shoulder axis rotation motor and a Z-drive motor; and
    an articulated arm having a configuration that has a common shoulder joint and a predetermined number of articulating joints, the articulated arm being connected to the drive section for articulation of at least one of the articulating joints so that the articulating joints are moved independently by the drive section and effect transport motion with the articulated arm along a transport plane;
    wherein the frame is of a semi-monocoque configuration and includes a substantially rigid spine that includes at least one shoulder drive of the shoulder drive section and engaged with each motor of the shoulder drive section and the articulated joint drive section so that each motor depends from the substantially rigid spine and static and dynamic driving loads generated by all motors of the shoulder drive section and the articulated joint drive section and all drive transmissions drivingly coupling the motors of the shoulder drive section and the articulated joint drive section to the articulated arm effecting the transport motion of the articulated arm bear against and are transmitted via the substantially rigid spine to the semi-monocoque frame so as to be borne by the semi-monocoque frame and the substantially rigid spine, integral to and with the semi-monocoque frame, onto a base of the semi-monocoque frame, the substantially rigid spine being distinct from and substantially rigid relative to adjacent integral sections of the semi-monocoque configuration that are adjacent the substantially rigid spine, where the substantially rigid spine is coupled to the adjacent integral sections of the semi-monocoque configuration of the frame so that the adjacent integral sections depend from the substantially rigid spine and the substantially rigid spine fixes the attitude of the transport plane.

2. The substrate transport apparatus of claim 1, wherein the spine is of unitary construction.

3. The substrate transport apparatus according to claim 1, wherein the articulated arm comprises a number of rigid arm links movably joined together to define the articulating joints.

4. The substrate transport apparatus according to claim 1, wherein the articulating joints are pivot joints.

5. The substrate transport apparatus according to claim 1, wherein the articulated arm is a scara arm having two end effectors.

6. The substrate transport apparatus according to claim 5, wherein the scara arm has a selectable configuration that is selectable between the arm having one of the two end effectors not being independently rotatable and the arm having both of the end effectors being independently rotatable.

7. The substrate transport apparatus according to claim 1, wherein the drive section has at least one selected motor module that is removably attachable as a unit to the articulated joint drive section.

8. The substrate transport apparatus according to claim 1, wherein the substantially rigid spine includes at least one kinematic coupling disposed therein, the kinematic coupling effecting an alignment of the transport plane.

9. The substrate transport apparatus according to claim 8, wherein the at least one kinematic coupling has a predetermined spatial relationship with at least a rotational axis of the shoulder drive section.

10. The substrate transport apparatus of claim 8, wherein the at least one kinematic coupling is disposed on a side of the substantially rigid spine and is configured to kinematically couple the frame to a substrate processing apparatus, aligning and fixing the transport plane within the substrate processing apparatus.

11. The substrate transport apparatus of claim 1, wherein all sections of the drive section and articulated arm supports formed by the drive section are directly connected to and supported by the substantially rigid spine.

12. The substrate transport apparatus of claim 1, wherein the substantially rigid spine defines a prime loading member that substantially carries all static and dynamic loads imparted on the frame by the drive section and articulated arm.

13. A substrate transport apparatus comprising:
a frame;
a drive section connected to the frame, the drive section including a shoulder drive section disposed in an articulated joint drive section, the shoulder drive section including a shoulder axis rotation motor and a Z-drive motor; and
an articulated arm having a configuration that has a common shoulder joint and a predetermined number of articulating joints, the articulated arm being connected to the drive section for articulation of at least one of the articulating joints so that the articulating joints are moved independently by the drive section and effect transport motion with the articulated arm along a substrate transport plane;
wherein the frame is of a semi-monocoque configuration and includes a drive section fixing member that includes at least one shoulder drive of the shoulder drive section and engaged with each motor of the shoulder drive section and the articulated joint drive section so that each motor depends from the drive section fixing member and static and dynamic driving loads generated by all motors of the shoulder drive section and the articulated joint drive section and all drive transmissions drivingly coupling the motors of the shoulder drive section and the articulated joint drive section to the articulated arm effecting the transport motion of the articulated arm bear against and are transmitted via the drive section fixing member so as to be borne by the semi-monocoque frame and the drive section fixing member, defined by a side of the semi-monocoque frame and integral to and with the semi-monocoque frame, onto a base of the semi-monocoque frame, the drive section fixing member being distinct from and substantially rigid relative to adjacent integral sections of the semi-monocoque frame that are adjacent the drive section fixing member, the drive section fixing member is coupled to the adjacent integral sections of the semi-monocoque frame so that the adjacent integral sections depend from the drive section fixing member and the drive section fixing member being configured to fix an arm lift axis so that an attitude of the arm lift axis with respect to the substrate transport plane is set by the drive section fixing member.

14. The substrate transport apparatus of claim 13, wherein the drive section fixing member is of unitary construction.

15. The substrate transport apparatus according to claim 13, wherein the articulated arm comprises a number of rigid arm links movably joined together to define the articulating joints.

16. The substrate transport apparatus according to claim 13, wherein the articulating joints are pivot joints.

17. The substrate transport apparatus according to claim 13, wherein the articulated arm is a SCARA arm having two end effectors.

18. The substrate transport apparatus according to claim 17, wherein the SCARA arm has a selectable configuration that is selectable between the arm having one of the two end effectors not being independently rotatable and the arm having both of the end effectors being independently rotatable.

19. The substrate transport apparatus according to claim 13, wherein the drive section has at least one selected motor module that is removably attachable as a unit to the articulated joint drive section.

20. The substrate transport apparatus according to claim 13, wherein the drive section fixing member includes at least one kinematic coupling disposed therein, the at least one kinematic coupling effecting an alignment of the substrate transport plane.

21. The substrate transport apparatus according to claim 20, wherein the at least one kinematic coupling has a predetermined spatial relationship with at least a rotational axis of the shoulder drive section.

* * * * *